(12) United States Patent
Yamasaki et al.

(10) Patent No.: US 7,366,965 B2
(45) Date of Patent: Apr. 29, 2008

(54) SEMICONDUCTOR INTEGRATED CIRCUIT

(75) Inventors: Kaname Yamasaki, Kodaira (JP); Yoshio Takamine, Kokubunji (JP)

(73) Assignee: Renesas Technology, Corp., Tokyo (JP)

( * ) Notice: Subject to any disclaimer, the term of this patent is extended or adjusted under 35 U.S.C. 154(b) by 194 days.

(21) Appl. No.: 10/892,298

(22) Filed: Jul. 16, 2004

(65) Prior Publication Data
US 2005/0047260 A1    Mar. 3, 2005

(30) Foreign Application Priority Data
Aug. 28, 2003    (JP)    ............................. 2003-304277

(51) Int. Cl.
G11C 29/00    (2006.01)
G11C 7/00    (2006.01)
(52) U.S. Cl. ...................... 714/718; 365/201
(58) Field of Classification Search ................ 714/718; 365/201
See application file for complete search history.

(56) References Cited
U.S. PATENT DOCUMENTS 5,329,254 A * 7/1994 Takano ...................... 331/34
6,014,336 A * 1/2000 Powell et al. ............... 365/201
6,381,715 B1 * 4/2002 Bauman et al. ............. 714/718
6,823,485 B1 * 11/2004 Muranaka ................... 714/719
7,020,815 B2 * 3/2006 Jeddeloh ..................... 714/718
7,184,915 B2 * 2/2007 Hansquine et al. ......... 702/118
2002/0194558 A1 * 12/2002 Wang et al. ................. 714/718

FOREIGN PATENT DOCUMENTS
JP    10-162600    11/1996
JP    11-329000    5/1998

* cited by examiner

Primary Examiner—Jacques Louis-Jacques
Assistant Examiner—John J. Tabone, Jr.
(74) Attorney, Agent, or Firm—Reed Smith LLP; Stanley P. Fisher, Esq.; Juan Carlos A. Marquez, Esq.

(57) ABSTRACT

Test functions are expanded by adopting a self test part, and circuit scale is reduced by adding the self test part. A semiconductor integrated circuit includes a memory that includes plural memory banks and is accessed by specifying a bank address, an X address, and a Y address, and a self-test part that tests the memory in response to commands. The self-test part has an address counter covering plural addressing modes that are different in the updating of X addresses, Y addresses, and bank addresses. A variety of addressing modes provided expand BIST-based test functions.

9 Claims, 21 Drawing Sheets (QS<0:1>)

FIG. 22 a — ■ FOR ALL 0/1

| TX | TY | SD | PCB | TRC | QW<3:0> |
|----|----|----|-----|-----|---------|
| *  | *  | 1  | 0   | 0   | ***0    |
|    |    |    |     |     | ***1    |

X → 0 1 2 3 4 5 6 7
Y ↓
| | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 0 | 0 | 0 | 0 | 0 | 0 | 0 |
| 2 | 0 | 0 | 0 | 0 | 0 | 0 | 0 | 0 |
| 3 | 0 | 0 | 0 | 0 | 0 | 0 | 0 | 0 |
| 4 | 0 | 0 | 0 | 0 | 0 | 0 | 0 | 0 |
| 5 | 0 | 0 | 0 | 0 | 0 | 0 | 0 | 0 |
| 6 | 0 | 0 | 0 | 0 | 0 | 0 | 0 | 0 |
| 7 | 0 | 0 | 0 | 0 | 0 | 0 | 0 | 0 | b — ■ FOR SINGLE ROW/COLUMN STRIPE

| TX | TY | SD | PCB | TRC | QW<3:0> |
|----|----|----|-----|-----|---------|
| O  | X  | 0  | 0   | 0   | 1010    |
|    |    |    |     |     | 0101    |

※ TY IS USED FOR COLUMN STRIPE

| | 0 | 1 | 2 | 3 | 4 | 5 | 6 | 7 |
|---|---|---|---|---|---|---|---|---|
| 0 | 0 | 1 | 0 | 1 | 0 | 1 | 0 | 1 |
| 1 | 0 | 1 | 0 | 1 | 0 | 1 | 0 | 1 |
| 2 | 0 | 1 | 0 | 1 | 0 | 1 | 0 | 1 |
| 3 | 0 | 1 | 0 | 1 | 0 | 1 | 0 | 1 |
| 4 | 0 | 1 | 0 | 1 | 0 | 1 | 0 | 1 |
| 5 | 0 | 1 | 0 | 1 | 0 | 1 | 0 | 1 |
| 6 | 0 | 1 | 0 | 1 | 0 | 1 | 0 | 1 |
| 7 | 0 | 1 | 0 | 1 | 0 | 1 | 0 | 1 | c — ■ FOR DOUBLE ROW/COLUMN STRIPE

| TX | TY | SD | PCB | TRC | QW<3:0> |
|----|----|----|-----|-----|---------|
| O  | X  | 0  | 0   | 0   | 1100    |
|    |    |    |     |     | 0011    |

※ TY IS USED FOR COLUMN STRIPE

| | 0 | 1 | 2 | 3 | 4 | 5 | 6 | 7 |
|---|---|---|---|---|---|---|---|---|
| 0 | 0 | 0 | 1 | 1 | 0 | 0 | 1 | 1 |
| 1 | 0 | 0 | 1 | 1 | 0 | 0 | 1 | 1 |
| 2 | 0 | 0 | 1 | 1 | 0 | 0 | 1 | 1 |
| 3 | 0 | 0 | 1 | 1 | 0 | 0 | 1 | 1 |
| 4 | 0 | 0 | 1 | 1 | 0 | 0 | 1 | 1 |
| 5 | 0 | 0 | 1 | 1 | 0 | 0 | 1 | 1 |
| 6 | 0 | 0 | 1 | 1 | 0 | 0 | 1 | 1 |
| 7 | 0 | 0 | 1 | 1 | 0 | 0 | 1 | 1 | d — ■ FOR PCB

| TX | TY | SD | PCB | TRC | QW<3:0> |
|----|----|----|-----|-----|---------|
| O  | X  | 0  | 1   | 0   | 1010    |
|    |    |    |     |     | 0101    |

| | 0 | 1 | 2 | 3 | 4 | 5 | 6 | 7 |
|---|---|---|---|---|---|---|---|---|
| 0 | 0 | 1 | 0 | 1 | 0 | 1 | 0 | 1 |
| 1 | 1 | 0 | 1 | 0 | 1 | 0 | 1 | 0 |
| 2 | 0 | 1 | 0 | 1 | 0 | 1 | 0 | 1 |
| 3 | 1 | 0 | 1 | 0 | 1 | 0 | 1 | 0 |
| 4 | 0 | 1 | 0 | 1 | 0 | 1 | 0 | 1 |
| 5 | 1 | 0 | 1 | 0 | 1 | 0 | 1 | 0 |
| 6 | 0 | 1 | 0 | 1 | 0 | 1 | 0 | 1 |
| 7 | 1 | 0 | 1 | 0 | 1 | 0 | 1 | 0 | e — ■ EXAMPLE OF THREE-CYCLE PATTERN

| TX | TY | SD | PCB | TRC | QW<3:0> |
|----|----|----|-----|-----|---------|
| O  | X  | 0  | 0   | 1   | *010    |
|    |    |    |     |     | *101    |

| | 0 | 1 | 2 | 3 | 4 | 5 | 6 | 7 |
|---|---|---|---|---|---|---|---|---|
| 0 | 0 | 1 | 0 | 0 | 1 | 0 | 0 | 1 |
| 1 | 0 | 1 | 0 | 0 | 1 | 0 | 0 | 1 |
| 2 | 0 | 1 | 0 | 0 | 1 | 0 | 0 | 1 |
| 3 | 0 | 1 | 0 | 0 | 1 | 0 | 0 | 1 |
| 4 | 0 | 1 | 0 | 0 | 1 | 0 | 0 | 1 |
| 5 | 0 | 1 | 0 | 0 | 1 | 0 | 0 | 1 |
| 6 | 0 | 1 | 0 | 0 | 1 | 0 | 0 | 1 |
| 7 | 0 | 1 | 0 | 0 | 1 | 0 | 0 | 1 |

SEMICONDUCTOR INTEGRATED CIRCUIT

CROSS-REFERENCE TO RELATED APPLICATION

The present application claims priority from Japanese patent application JP 2003-304277 filed on Aug. 28, 2003, the content of which is hereby incorporated by reference as if set forth herein.

FIELD OF THE INVENTION

The present invention relates to semiconductor device testing technology, and more particularly a built-in self test (BIST) for testing memory built as a semiconductor integrated circuit.

BACKGROUND OF THE INVENTION

Japanese Unexamined Patent Publication No. Hei 11(1999)-329000 describes a semiconductor integrated circuit having a BIST circuit capable of high-speed processing by command sequencers and internal clock generating circuits. This sequencer-based BIST technology is limited by the available number and type of test sequences, and hence does not cover a variety of test sequences.

Japanese Unexamined Patent Publication No. Hei 11(1998)-162600 describes semiconductor storage with a built-in BIST circuit comprising a test clock generator, an address counter, and a sequencer. The circuit scale of this built-in BIST circuit increases when a PLL circuit is adopted as the test clock generator. This is because the PLL circuit requires a voltage controlled oscillator and a D/A converter, and thus requires a voltage controlled current source and additional circuitry.

Further, if data retention tests for semiconductor storages, such as DRAM, are used, the wait time for the data retention test may eliminate the usefulness of a high-speed tester. However, in the known art the use of a low-speed tester has also been highly undesirable.

Thus, the need exists for a semiconductor device and method having a BIST circuit that provides an acceptable testing time without necessitating a substantial increase in circuit area.

SUMMARY OF THE INVENTION

The present invention provides a semiconductor integrated circuit including a self-test unit, such as a BIST circuit, that reduces any increase in circuit scale required by the addition of the self-test circuit.

A semiconductor integrated circuit according to the present invention may include a memory (5) that includes a plurality of memory banks accessible by specification of a bank address, an X address, and a Y address, and may include a self-tester (3) that tests the memory. The memory banks may include a plurality of dynamic-type memory cells arrayed in matrix, and the semiconductor integrated circuit including the memory banks may be configured as synchronous DRAM, for example. The self-tester may have a plurality of modes for generating access addresses to test the memory. The plurality of modes for generating access addresses may differ in the manner of updating X addresses, Y addresses, and bank addresses. The self-tester may thus include an address counter (35) that accommodates the plurality of addressing modes. The plurality of addressing modes provided for testing allows for expansion of BIST-based test functions.

The plurality of modes for generating access addresses may be selected from single bank X scanning that updates bank addresses after one round of X addresses, single bank Y scanning that updates bank addresses after one round of Y addresses, and/or multi-bank X scanning that updates X addresses after one round of bank addresses.

The self-tester may include a plurality of test sequencers (31) corresponding to the plurality of test modes. The plurality of test sequencers may be selectable. By providing a plurality of test sequencers each correspondent to a test mode, the area of a semiconductor integrated circuit can be reduced in comparison to program-controlled, general-purpose sequencers that require memory to store programs. In short, it is more simplistic to add and delete individual sequencers according to the selected testing, and thereby customization may be performed, and overhead reduced, for semiconductor integrated circuits through the use of the present invention.

A semiconductor integrated circuit according to the present invention may additionally include a write data generating circuit (36) that generates write data for testing in the plurality of modes by using a shift register having a feedback loop. More specifically, the write data generating circuit may include a shift register (QW0 to QW3), a first feedback loop (61) through which the output of an output side start storage stage (QW0) of the shift register may be fed back to the input of an output side end storage stage (QW3), a first selector (62) that may selectively feed back the output of the output side start storage stage to the input of the start storage stage, and a second selector (64) that may select between the output and input of the output side start storage stage. Since the write data generating circuit uses a shift register having a feedback loop, rather than a general-purpose pattern generating circuit configured to selectively generate given patterns upon the loading of control data stored in a ROM as in a typical ALPG (algorithmic pattern generator), a plurality of write data types may be generated on a comparatively small logical scale.

A clock generating circuit (32) may generate a clock signal for test (CKIN) for the memory. The clock generating circuit may include a ring oscillator (70) capable of changing the number of gate stages of an oscillation loop, changeable frequency dividers (71 to 73) that frequency-divide the output of the ring oscillator, and an oscillation frequency control circuit that controls the number of gate stages of the oscillation loop based on a comparison between a predetermined output of the changeable frequency dividers and an external clock signal. The external clock signal (CKEX) may be a clock signal of a relatively low frequency, such as an operation frequency supported by a low-speed tester. If the frequency division ratio of the clock signal used as a test clock signal is smaller than that of the clock signal (CKC) inputted to the comparator (74), the frequency of the test clock signal (CKIN) can be made higher than the low-speed clock signal (CKEX) of the tester. Further, since the ring oscillator (70) capable of changing the number of gate stages of an oscillation loop is used to generate the desired frequency, rather than a PLL circuit, circuit scale can be significantly reduced at a small cost of accuracy of frequency synchronization, thereby allowing for a reduction in chip area.

The ring oscillator may include a plurality of selectable oscillation loops that differ in the number of gate stages. The oscillation frequency control circuit may include a frequency comparator 74 that compares predetermined output of the changeable frequency dividers with the frequency of an external clock signal, and a counter 75 that increments or decrements a count value according to the comparison by the frequency comparator. The count value of the counter may be used to select an oscillation loop of the ring oscillator so as to match the predetermined output of the changeable frequency dividers to the frequency of the external clock signal.

Thus, the present invention provides a semiconductor device and method having a BIST circuit that provides an acceptable testing time without necessitating a substantial increase in circuit area.

BRIEF DESCRIPTION OF THE DRAWINGS

The various features of the present invention will now be described in greater detail with reference to the drawings of aspects of the present invention, and various related elements thereof, wherein like reference numerals designate like elements, and wherein:

FIG. 22 illustrates generating write data by a write data generating circuit;

DETAILED DESCRIPTION

It is to be understood that the figures and descriptions of the present invention have been simplified to illustrate elements that are relevant for a clear understanding of the present invention, while eliminating, for purposes of clarity, many other elements found in a typical semiconductor device and method. Those of ordinary skill in the art will recognize that other elements are desirable and/or required in order to implement the present invention. But because such elements are well known in the art, and because they do not facilitate a better understanding of the present invention, a discussion of such elements is not provided herein. The disclosure herein is directed to all such variations and modifications to the applications, networks, systems and methods disclosed herein and as will be known, or apparent, to those skilled in the art.

Figure 2:
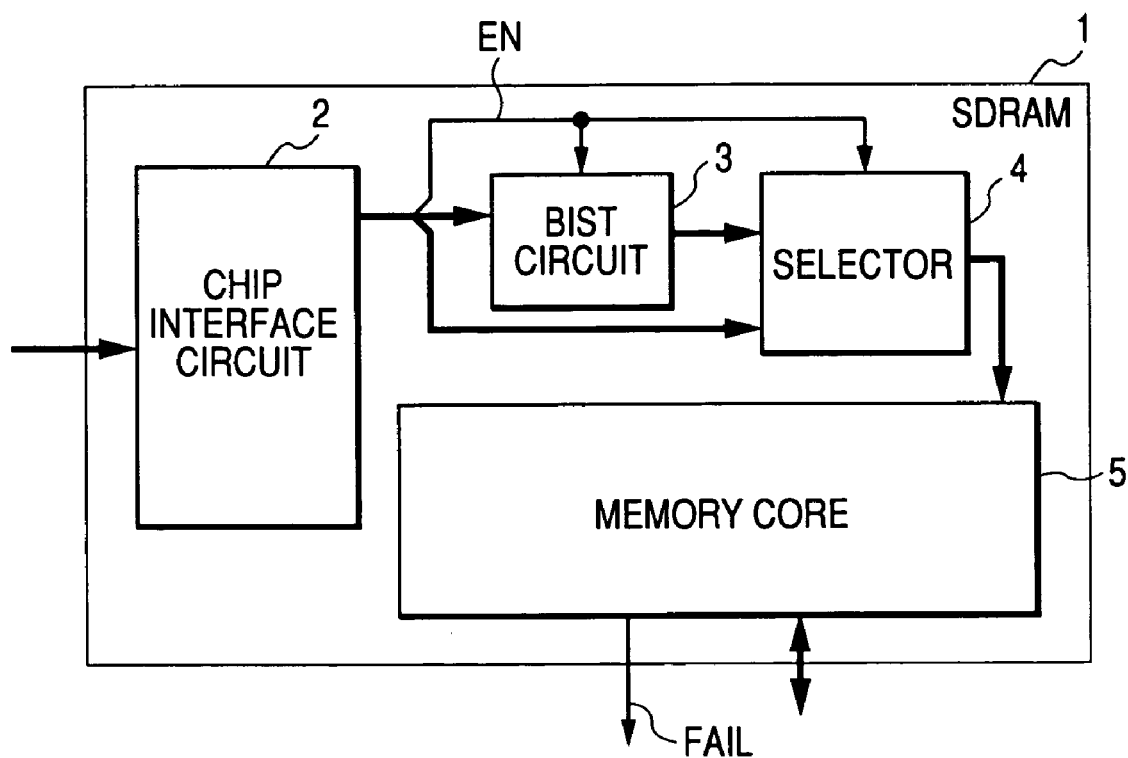
FIG. 2 is a block diagram showing a synchronous DRAM (SDRAM)

FIG. 2 illustrates a synchronous DRAM (SDRAM). SDRAM 1 is formed on a semiconductor board, such as a single-crystal silicon, by a known semiconductor integrated circuit manufacturing technology. Synchronous DRAM 1 may include a chip interface circuit 2, a BIST circuit 3 as a self-tester, a selector 4, and a memory, such as memory core 5. The chip interface circuit 2 may be supplied with an address signal and a memory access control signal. When a test enable signal, EN, is enabled by a memory access control signal, test operations by the BIST circuit 3 are enabled. The selector 4 then selects a test address and a test control signal to be generated in the BIST circuit 3, and supplies them to the memory core 5. If the test operations on the memory core 5 by the test address and the test control signal result in an error, a fail signal, FAIL is generated. When the test enable signal, EN, is disabled, the selector 4 supplies the address signal and the memory access control signal, via the chip interface circuit 2, to the memory core 5. Thereby, the memory core 5 is operated.

Figure 3:
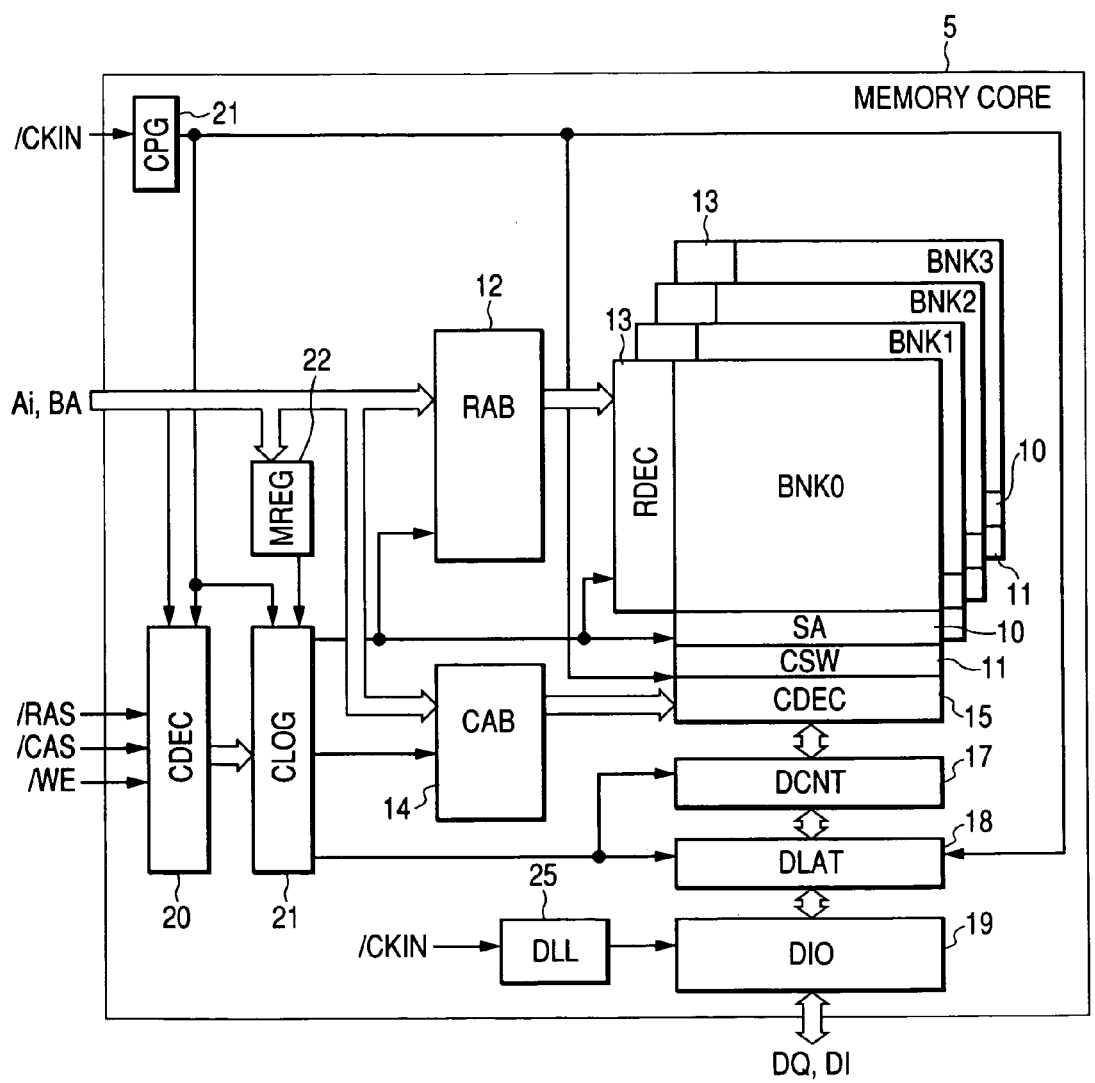
FIG. 3 is a block diagram showing a memory core included in an SDRAM.

FIG. 3 illustrates a memory core 5. The memory core 5 may, for example, include four memory banks, BNK0 to BNK3. Each of the memory banks BNK0 to BNK3 my include memory cells of dynamic type arranged in matrix, and terminals for selecting the memory cells may be connected to word lines. Data input-output terminals may be connected to bit lines. The bit lines may be connected with a sense amplifier train (SA) 10 and a column selection switch train (CSW) 11. The sense amplifier train 10 may sense and amplify storage information read into the bit lines.

A bank address signal BA for selecting a bank, and an X, Y address signal Ai for specifying X address (row address) and column address (Y address) in the bank, are generated. A row address signal is supplied to a row address buffer (RAB) 12 and to a row decoder (RDEC) 13 for selecting the word line. A column address signal is supplied to a column address buffer (CAB) 14, and to a column decoder (CDEC) 15, for selecting a column selection switch train 11. A bit line selected by the column decoder 15 may be conducted to a latch circuit (DLAT) 18 through a data control circuit (DCNT) 17. Data read from the memory banks and latched into the latch circuit 18 may be output, DQ, from a data input-output buffer (DIO) 19. Write data DI supplied to the data input-output buffer 19 may be latched into the latch circuit 18 and supplied to the memory banks.

A command decoder (CDEC) 20, a command logic (CLOG) 21, and a mode register (MREG) 22 may control the operation of the memory core 5. The command decoder 20 may receive access control signals /RAS, /CAS, and /WE, which are generally used in DRAM. A portion of the X, Y address signal Ai may be supplied to the command decoder 20 as an access command. The command decoder 20 may generat a command decode signal, correspondent to a combination of levels of the /RAS, /CAS, and /WE signals, and the access command, to the command logic 21. The command logic 21 may control operation timing for internal circuits, such as the row address decoder and the sense amplifier train. An internal clock signal /CKIN used for timing control may be generated by a clock generator (CPG) 24. Data output timing may be synchronized to a delay locked loop circuit (DLL) 25 synchronized to the clock signal /CKIN. A refresh circuit may also be included in a row address buffer 12.

Figure 1:
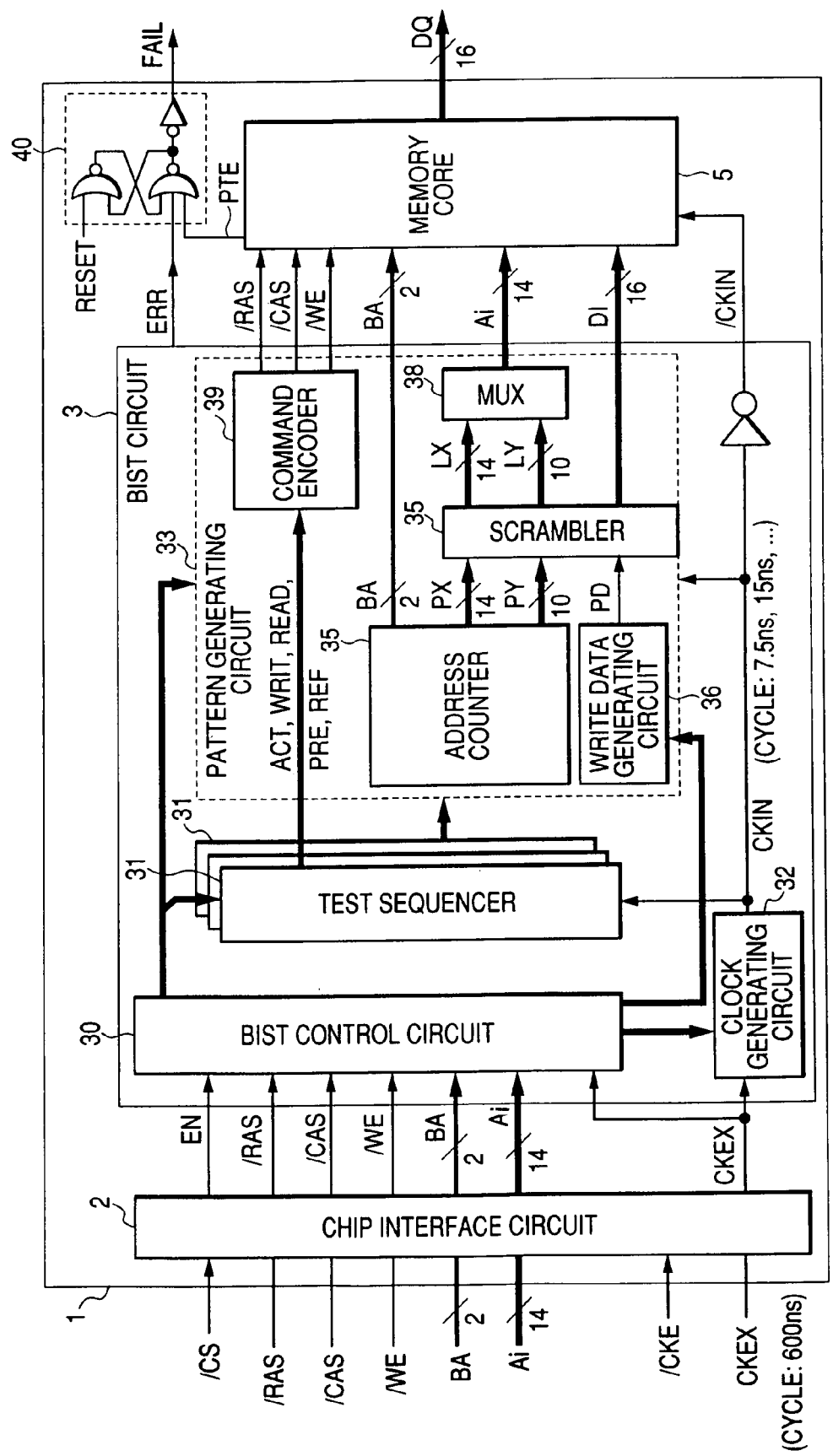
FIG. 1 is a block diagram showing a BIST circuit.

FIG. 1 illustrates a BIST circuit 3. The BIST circuit 3 may include a BIST control circuit 30, a plurality of test sequencers 31, a clock generating circuit 32, and a pattern generating circuit 33, for example. The pattern generating circuit 33 may include an address counter 35, a write data generating circuit 36, a scrambler 37, a multiplexer (MUX) 38, and a command encoder 39, for example.

The chip interface circuit 2 may provide for delivery of control signals /CS, /RAS, /CAS, and /WE, a bank address signal BA, an X, Y address signal Ai, a clock enable signal /CKE, and an external clock signal CKEX, to the BIST circuit 3. In an exemplary embodiment, the external clock signal CKEX may have a low-speed clock cycle time of 600 ns. Control signal /CS may be a chip select signal that selects the operation of SDRAM1. Control signal /RAS may designate a row address strobe signal. Control signal /CAS may designate a column address strobe signal. Control signal /WE may designate a write enable signal. The chip interface circuit 2 may enable the external clock signal CKEX when the clock enable signal /CKE is enabled, and, synchronously with the external clock signal CKEX, may capture control signals /CS, /RAS, /CAS, and /WE, and address signals BA and Ai. When the captured control signals /CS, /RAS, /CAS, and /WE are at prescribed levels, the chip interface circuit 2 may assume the enable signal EN to be properly at an enable level, and may direct the BIST circuit 3 to enter the BIST mode.

When the signal EN is enabled, the BIST control circuit 30 may capture control signals /RAS, /CAS, and /WE, the bank address signal BA, the X, Y address signal Ai, and the external clock signal CKEX, as outputted from the chip interface circuit 2. Upon recognizing the BIST mode enable signal EN, the BIST control circuit 30 may successively capture a start address of the test to be performed, an initial value of write data, a sequence command, or other control information, from an input route of the address signal Ai. The BIST control circuit 30 may generate control information to the clock generating circuit 32 to select the frequency of clock signals CKIN and /CKIN for the test, may send the sequence command to the test sequencer 31, and may send control information to the pattern generating circuit 33.

The plurality of test sequencers 31 may be provided correspondent to the plurality of test modes. A test sequencer 31 corresponding to a given sequence command may generate test control codes ACT, WRIT, READ, PRE, and REF to a command encoder 39, according to the test operation procedure. The command encoder 39 generates the test control signal /RAS, /CAS, or /WE to the memory core 5, according to a test control code. In parallel, the test sequencer 31 may control the generation by the address counter 35 of an address pattern corresponding to the sequence command, and the test sequencer may generate an X address signal PX, a Y address signal PY, and the bank address signal BA. The X address signal PX and the Y address signal PY may be scrambled in the scrambler 37 and passed to the memory core 5 by the address multiplexer 38, and the bank address signal BA may also be passed to the memory core 5. The initial value of write data necessary for the test operation may be loaded from the BIST control circuit 30 to the write data generating circuit 36, and, according to the test procedure by the test sequencer 31, write data generated by the write data generating circuit 36 may be supplied via the scrambler 37 to the memory core 5 as write data DI. The test control code ACT denotes a word line selection, WRIT denotes a data write, READ denotes a data read, PRE denotes a precharge, and REF denotes a refresh.

The memory core 5 performs memory test operations in accordance with the control of the BIST circuit 3. For example, the memory core 5 internally detects a mismatch between write data and read data, and outputs a detection result as a parallel test result PTE. In this example, the parallel test result PTE may be a logical high (i.e. logical value "1") when a mismatch is detected. For a mismatch detection by the parallel test result PTE, or an anomaly detection by state anomaly detection result ERR, of the BIST circuit 3, the resulting detection may be held in latch 40 and outputted as a fail signal FAIL.

Figure 4:
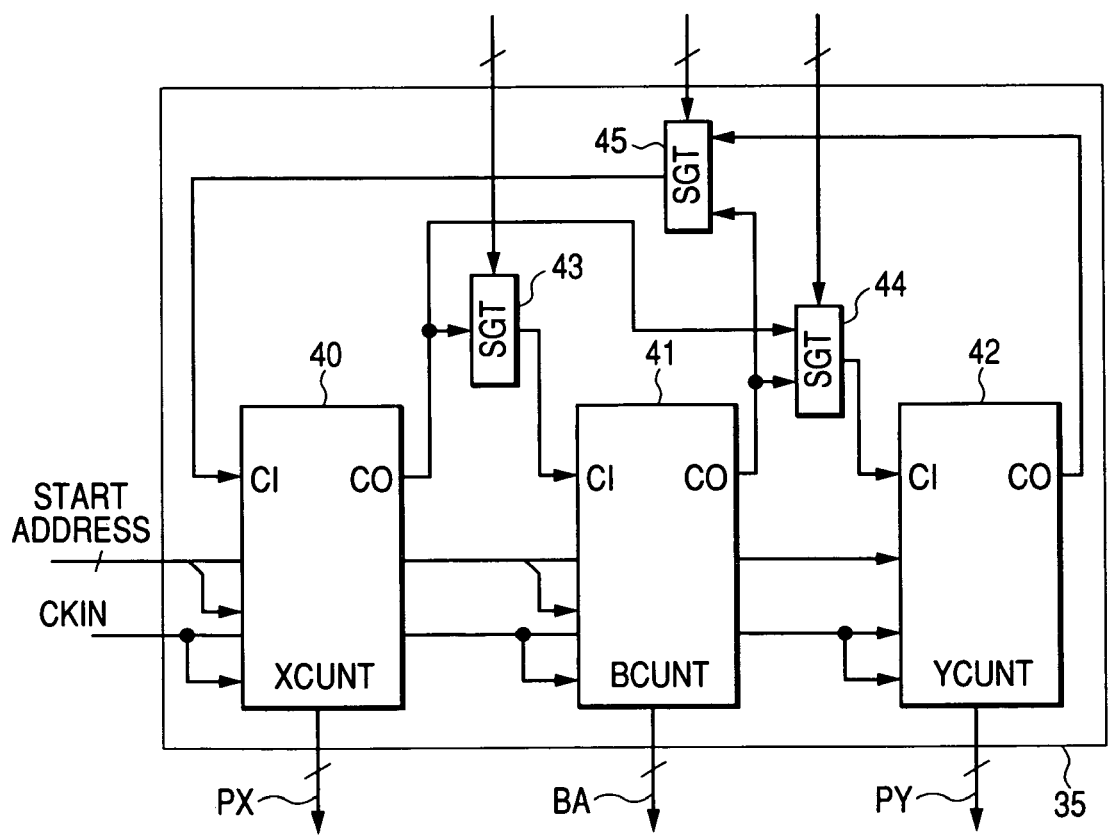
FIG. 4 is a block diagram showing an address counter.

FIG. 4 illustrates an address counter 35. The address counter 35 may include a counter (XCUNT) 40 for X address PX, a counter (BCUNT) 41 for bank address BA, a counter (YCUNT) 42 for Y address, and selection gates (SGT) 43 to 45 that selectively connect carry output CO and carry input CI of counters 40 to 42. The SGT 43 may select high power impedance, and the SGTs 44 and 45 may select output for one of two inputs or high power impedance. By switching carry transmission paths between the counters 40 and 42 via the SGTs 43 to 45, a variety of addressing modes may be available. A start address may be preset at the counters 40 to 42 by the BIST control circuit 30. The counters 40 to 42 may perform count operation synchronously with the clock signal CKIN. The operation of the counters 40 to 42 and the selection gates 43 to 45 is controlled by output of the test sequencer 31.

Figure 5:
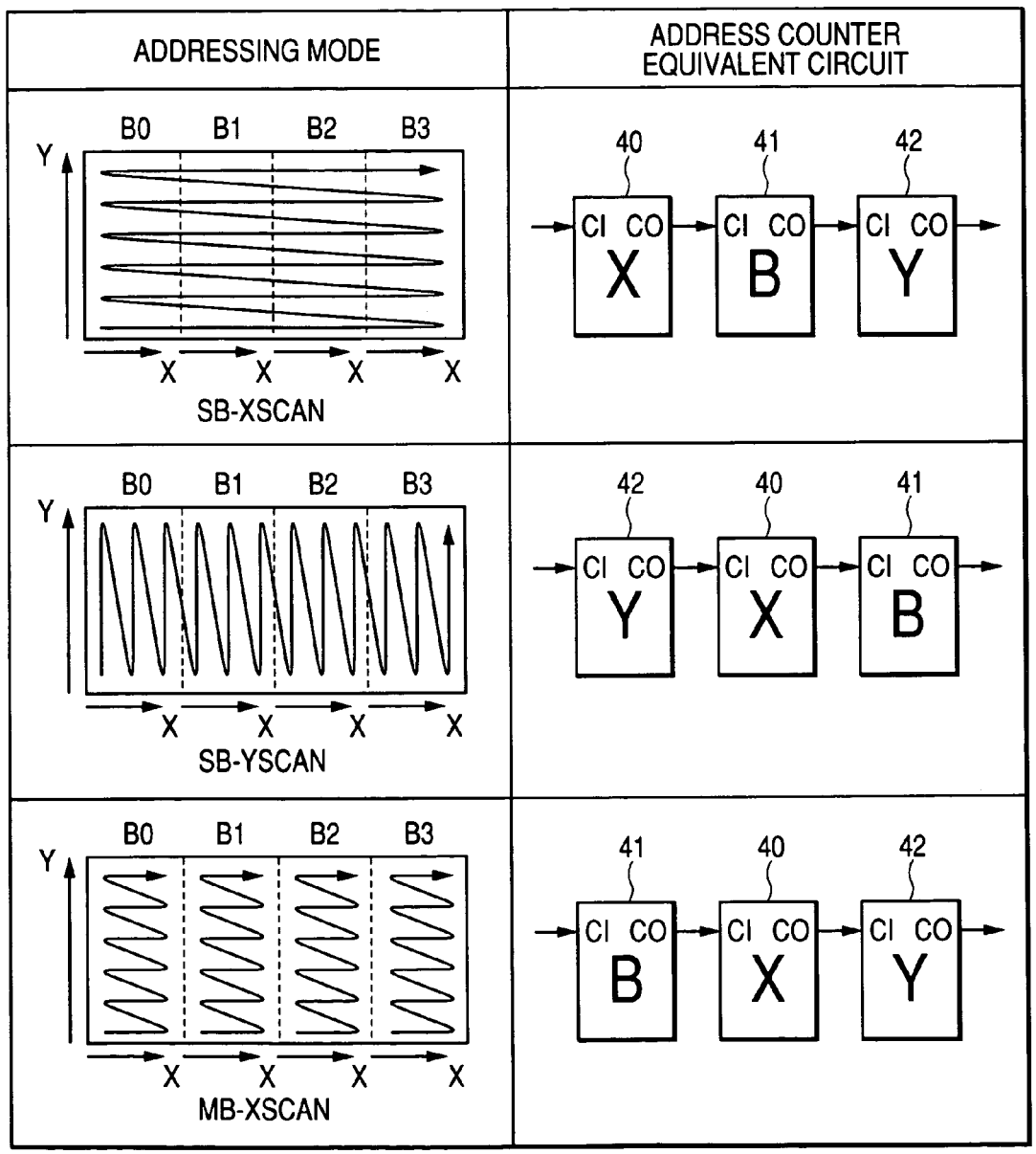
FIG. 5 illustrates addressing modes by an address counter.

FIG. 5 illustrates addressing modes for an address counter 35. Illustrated are single bank X scanning (SB-XSCAN) that updates bank addresses after one round of X addresses, single bank Y scanning (SB-YSCAN) that updates bank addresses after one round of Y addresses, and multi-bank X scanning (MB-XSCAN) that updates X addresses after one round of bank addresses. Addressing modes in the individual addressing modes, and connection states of carry transmission paths, are also illustrated.

Figure 6:
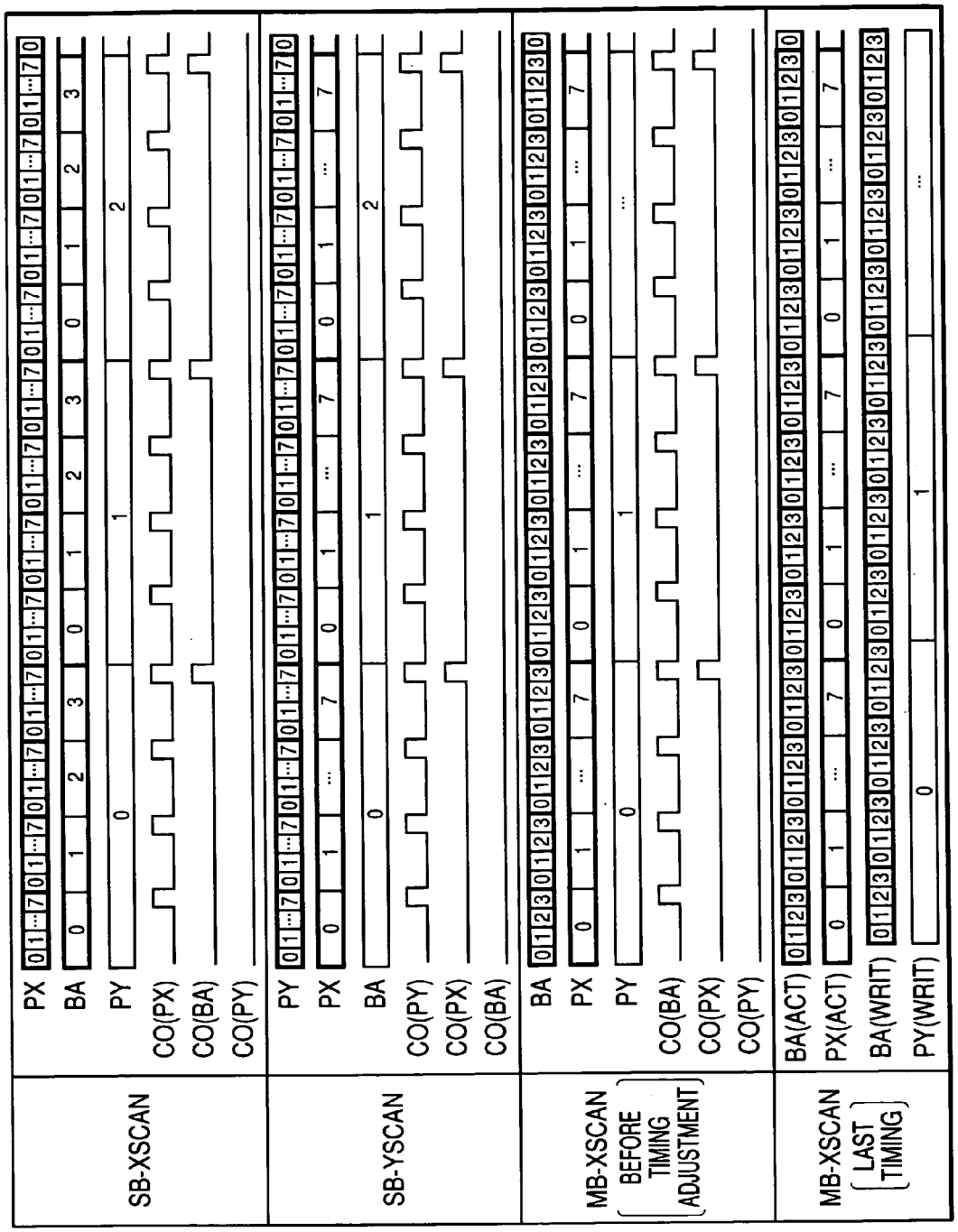
FIG. 6 is a timing chart showing the operation timing of an address counter in SB-XSCAN, its operation timing in SB-YSCAN, and its operation timing in MB-XSCAN.

FIG. 6 illustrates timing of an address counter 35 in SB-XSCAN, timing in SB-YSCAN, and timing in MB-XSCAN. CO (PX) designates a carry output of XCUNT 40, CO (BA) designates a carry output of BCUNT41, and CO (PY) designates a carry output of YCUNT 42. MB-SCAN (last timing) illustrates that a bank address BA (WRIT) and a Y address PY (WRIT) for data write operation (WRIT) may be outputted out of phase with the word line selection operation (ACT). This may prevent access inefficiency caused by successively updating bank addresses.

The address counter 35 generates the SB-XSCAN, SB-YSCAN, and MB-XSCAN addressing modes, and may switch the carry paths among the counters 40 to 42 for bank addresses, X addresses, and Y addresses. Since the address counter 35 provides for the MB-XSCN mode, it can also be applied to multi-bank memories in mass-storage memories, for example. As such, and because the BIST allows a variety of addressing modes for memory tests, the BIST circuit 3 can be used for not only burn-in and probe inspection, but also for selection.

Figure 7:
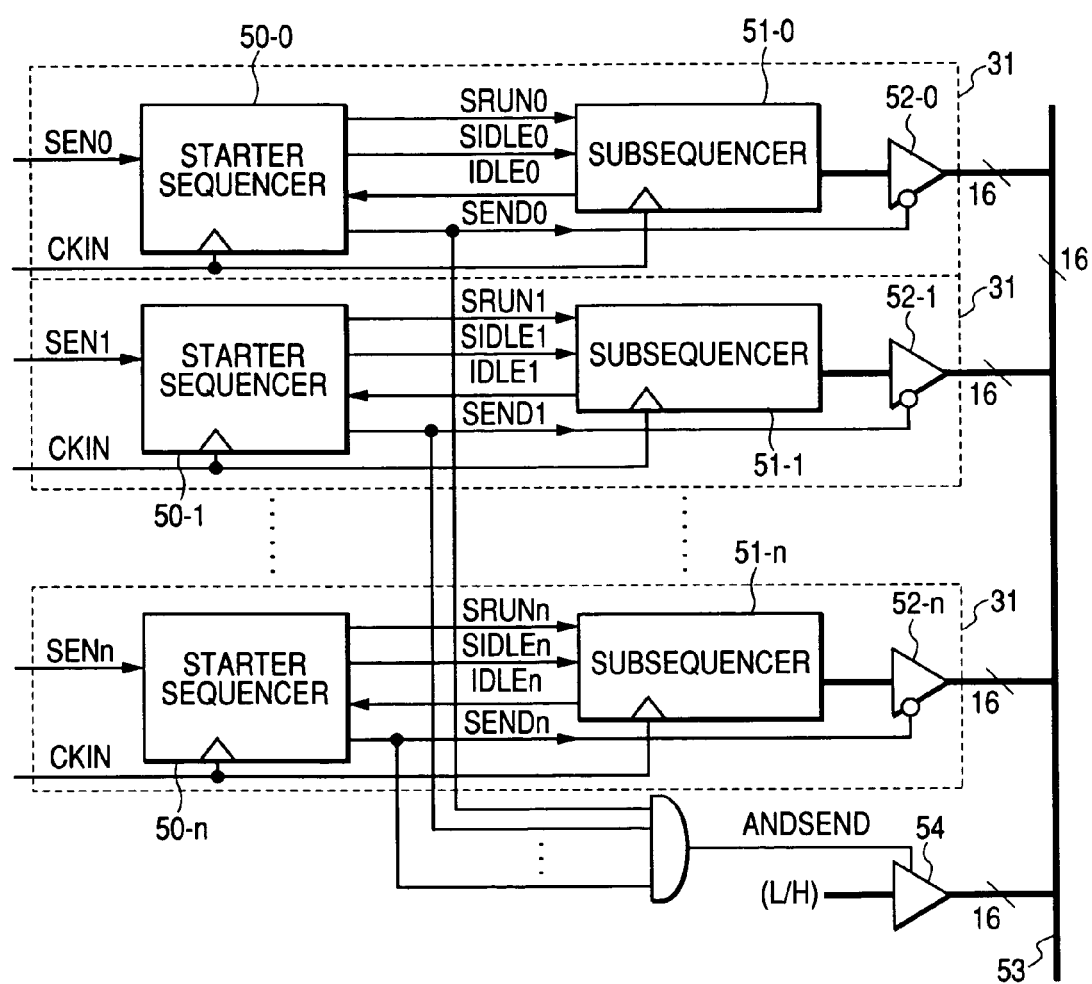
FIG. 7 is a block diagram showing test sequencers.

FIG. 7 illustrates test sequencers 31. The test sequencers 31 may include a control logic set for a starter sequencer 50-*i* (i=0 to n), and a subsequencer logic set 51-*i*; and thus the BIST circuit 3 may include a plurality of sequencer sets.

A starter sequencer 50-*i* may be triggered to start operation by a selection signal SENi outputted from the BIST control circuit 30. The sequencer enable signal SENi may be a signal corresponding to a sequence command from the BIST control circuit 30. The starter sequencer 50-*i* may function as a state machine to control state transition, which state transition may be in accordance with an IDLEi signal sent from a subsequencer 51-*i* corresponding to the signal SENi. According to the state, the starter sequencer 50-*i* may output signals SRUNi, SIDLEi, and SENDi. A subsequencer 51-*i* may also act as a state machine to control state transition, and the state transition may be in accordance with signals SRUNi and SIDLEi. According to the state, the subsequencer 51-*i* may output a 16-bit control signal. The 16-bit control signal may be supplied from a 16-bit bus 53 to subsequent stages through a tri-state buffer 52-*i*. The tri-state buffer 52 may be placed into a high power impedance state by the signal SENDi going high. The signal SENDi may be at a high when the starter sequencer 50-*i* is in an idle state or wait state, that is, when control of the pattern generating circuit 33 is substantially stopped. As a result, only the output of a test sequencer 31 selected to operate may be supplied to the bus 53. Control wiring is not required for each of the test sequencers 31. To suppress a floating state of the bus 53 when the operation of all the test sequencers 31 is stopped, a tri-state buffer 54 may be provided to force the bus 53 to a low level via the logical product signal ANDSEND of all signals SEND0 to SENDn.

Figure 8:
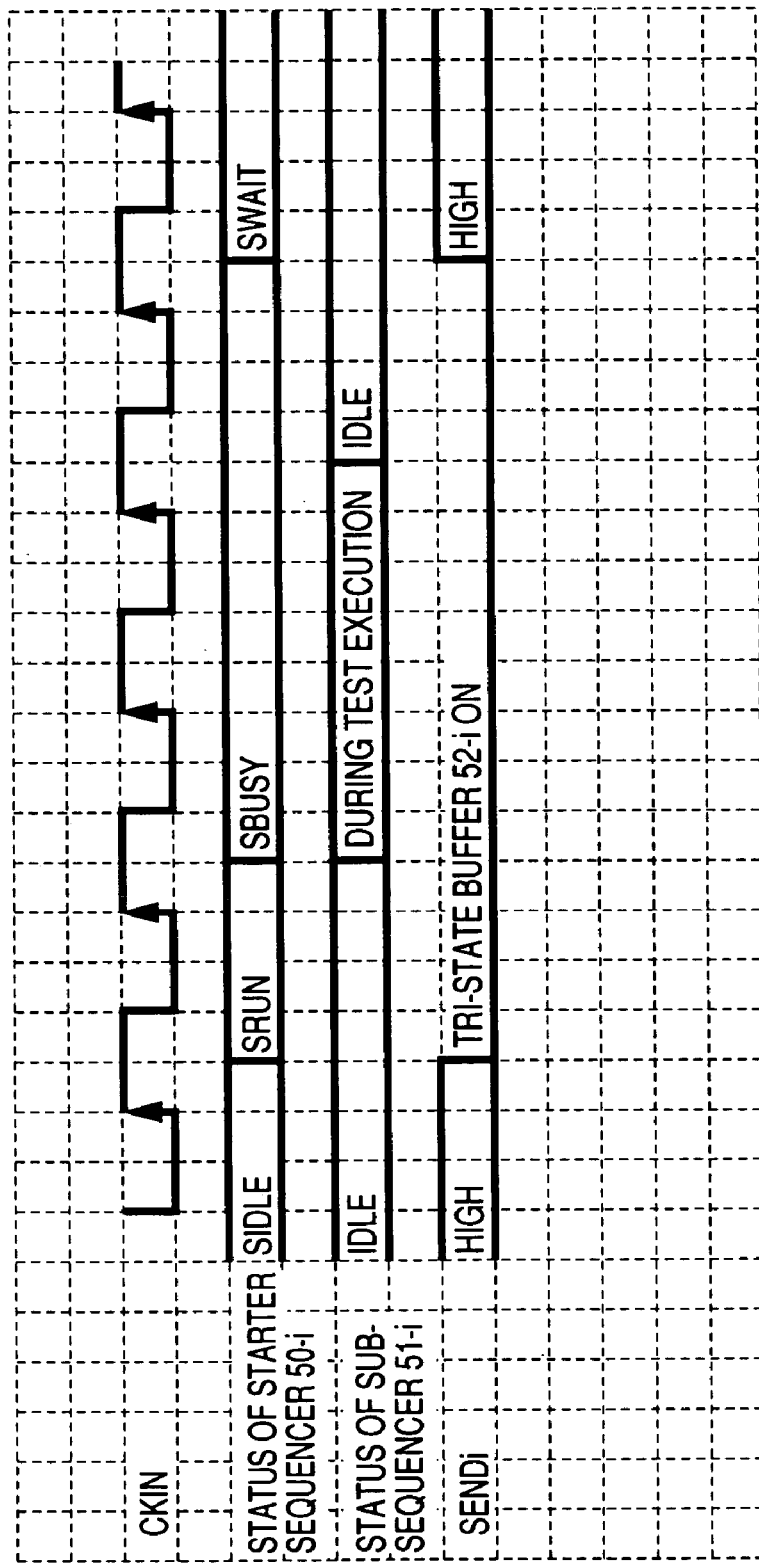
FIG. 8 is a timing chart showing the state of a starter sequencer and the state of a tri-state buffer.

FIG. 8 illustrates the state of a starter sequencer 50-*i* and the state of a tri-state buffer 52-*i*. The tri-state buffer 52-*i* is put into a high power impedance state when the starter sequencer 50-*i* is in an idle state or wait state, that is, when control of the pattern generating circuit 33 is substantially stopped.

Figure 9:
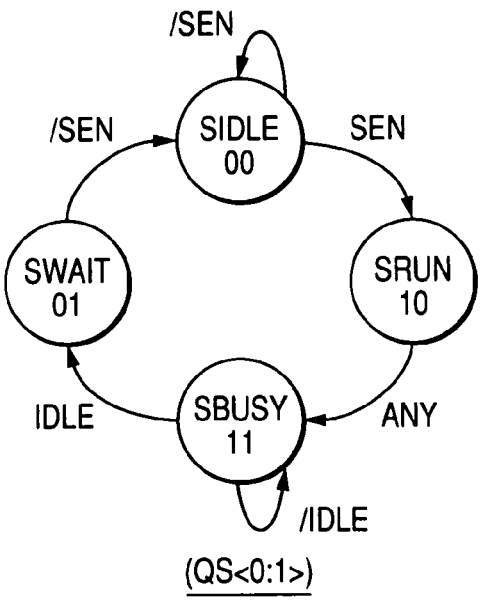
FIG. 9 is a state transition diagram of starter sequencer.

FIG. 9 illustrates a state transition diagram of starter sequencer 50-*i*. Among the states are IDLE, SRUN, SBUSY, and SWAIT. SEN (/SEN) and IDLE are shown as trigger signals for state transition.

Figure 10:
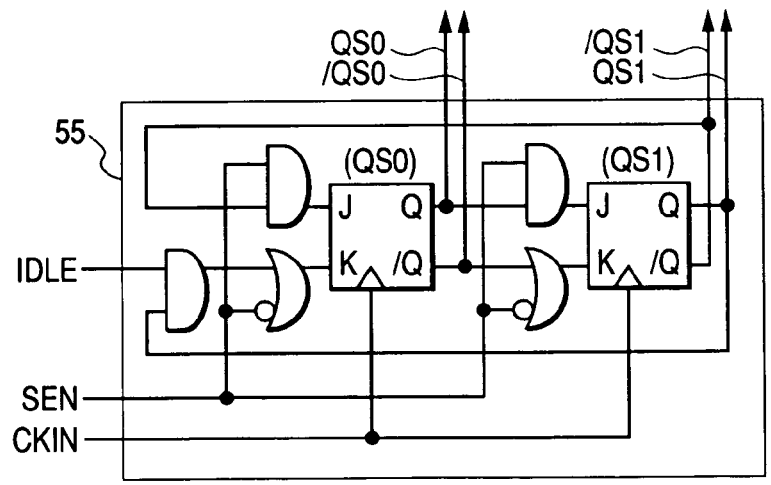
FIG. 10 is a logical circuit diagram showing a logical configuration of a state machine of starter sequencer.

FIG. 10 illustrates a logical configuration of a state machine 55 of starter sequencer 50-*i*. The state machine 55 may be configured by a 2-bit Johnson counter consisting of QS0 and QS1.

Figure 11:
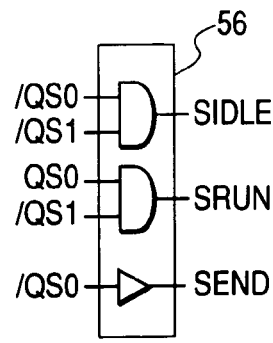
FIG. 11 is a logical circuit diagram showing a decoding part for 2 bits, QS0 and QS1, of a state machine.

FIG. 11 shows a decoder 56 for the 2 bits QS0 and QS1 of the state machine 55. The decoder 56 outputs the signals SIDLE, SRUN, and SEND. 2-bit values (00, 10, 11, 01) shown in the individual states of FIG. 9 denote the values of QS0 and QS1 (QS<0:1>).

Any of the starter sequencers 50-*i* may have the same logical configuration. The logical configurations of the subsequencers 51-*i* may be individualized depending on the mode of test operation.

Figure 12:
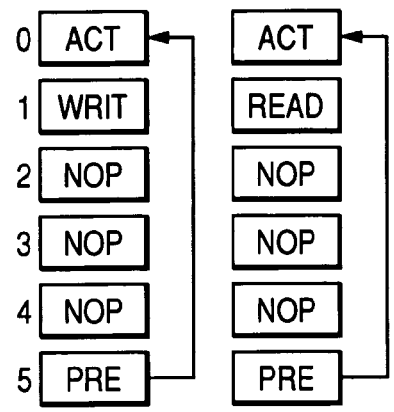
FIG. 12 illustrates a timing sequence of SB-Write/Read.

FIG. 12 shows a timing sequence of a SB-Write/Read. In a write operation, ACT, WRIT, NOP, NOP, NOP, and PRE may be executed in the order set forth, for example. In a read operation, ACT, READ, NOP, NOP, NOP, and PRE may be executed in the order set forth, for example. In the PRE, the X address counter may be forcibly incremented, such as to perform writing or reading for the next address.

Figure 13:
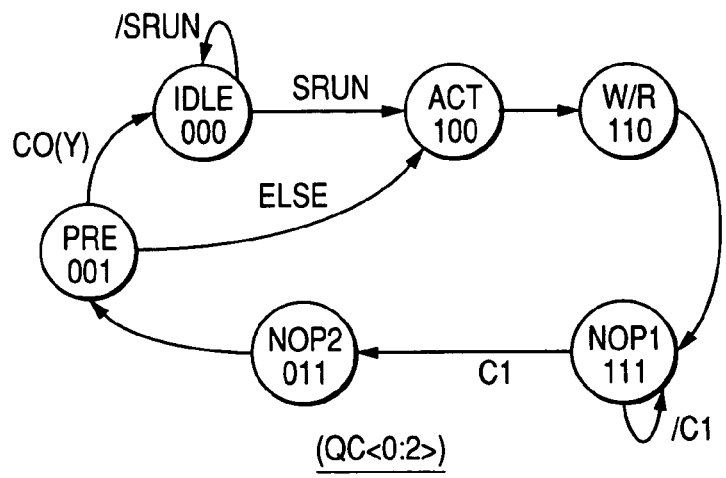
FIG. 13 is a diagram showing state transition of subsequencer associated with SB-Write/Read.

FIG. 13 shows state transition (timing state transition diagram) of a subsequencer associated with SB-Write/Read, whereby the timing sequence of FIG. 12 is obtained. In FIG. 13, W/R denotes WRITE or READ. CO (Y) denotes carry output of Y counter YCUNT42. The precharge (PRE) state may switch to the idle state (IDLE) based on the carry output because, during a single bank operation, bank addresses may be updated after one round of X addresses, Y addresses may be updated after one round of bank addresses, and a test may terminate after one round of Y addresses.

Figure 14:
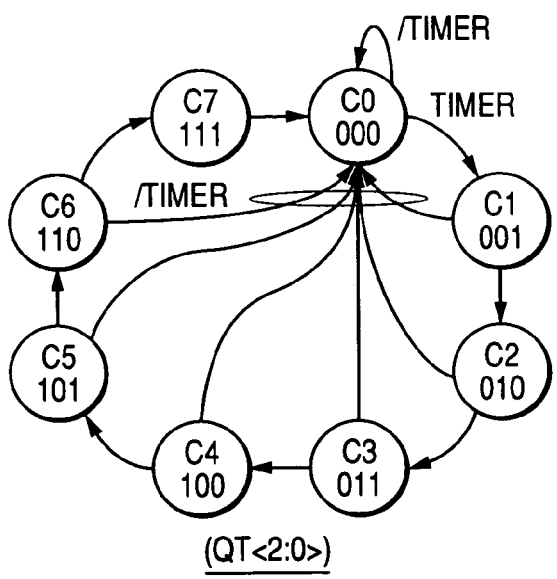
FIG. 14 is a diagram showing state transition of a general-purpose timer of a subsequencer.

FIG. 14 is a state transition diagram of a general-purpose timer of a subsequencer. A general-purpose timer may be adopted to prevent an increase in the logical size of the sequencers. The states of the general-purpose timer may transition from C0 to C7 in accordance with a timer call signal TIMER. Each of the states, C1 to C7, may correspond to one NOP.

Figure 15:
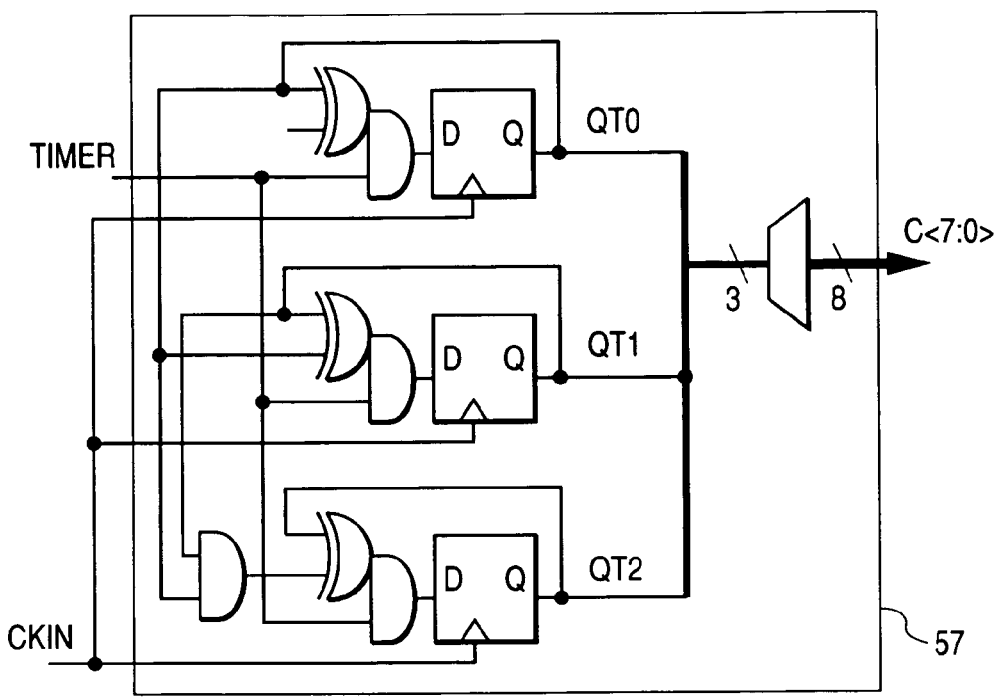
FIG. 15 is a logical circuit diagram showing a logical configuration of a general-purpose timer.

FIG. 15 shows a logic configuration of a general-purpose timer 57. The general-purpose timer 57 may be configured with a 3-bit binary counter. The 3 bits QT0 to QT2 of the binary counter may be decoded into an 8-bit signal C<7:0>. When the timer call signal TIMER is at a low level, a count operation is halted, and when at a high level, the count operation is started.

Figure 16:
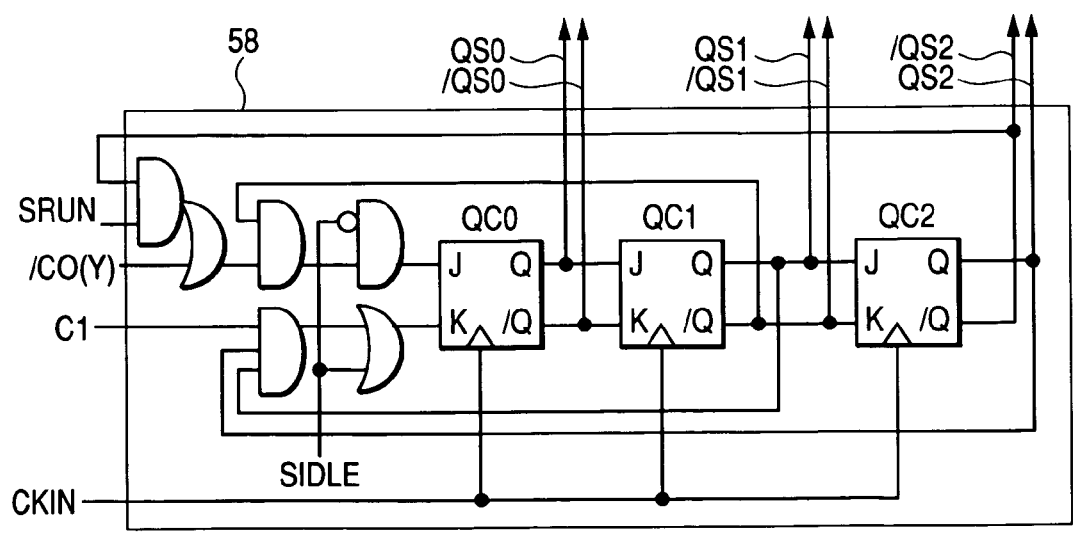
FIG. 16 is a logical circuit diagram showing a logical configuration of a state machine of a subsequencer.

FIG. 16 shows a logic configuration of a state machine 58 of a subsequencer. The state machine 58 may be configured by a 3-bit Johnson counter including bits QC0, QC1, and QC2.

Figure 17:
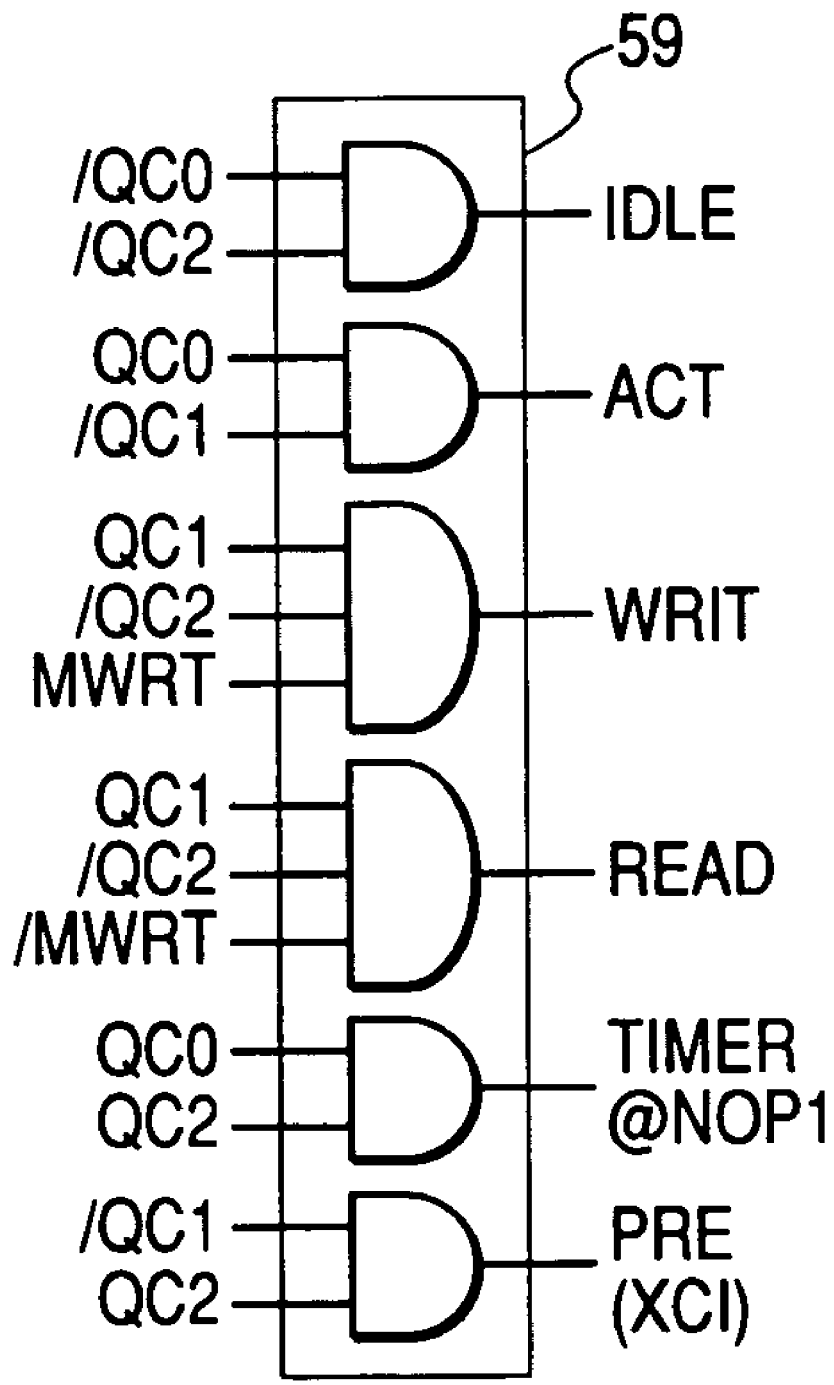
FIG. 17 illustrates a decoding part for 3 bits, QC0, QC1, and QC2, of a state machine.

FIG. 17 shows a decoder 59 for the 3 bits QC0, QC1, and QC2 of the state machine 58. The decoder 59 may output signals IDLE, ACT, WRIT, READ, TIMER, and PRE. IDLE, ACT, WRIT, READ, and PRE may be supplied to the command encoder 39. TIMER may be supplied to a general-purpose timer 57. MWRT is a write mode signal given by the BIST control circuit 30 as a result of decoding a test command. 3-bit values (000, 100, 110, 111, 011, 001) shown in the individual states of FIG. 13 denote the values of QC0, QC1, and QC2 (QC<0:2>) in the respective states.

Figure 18:
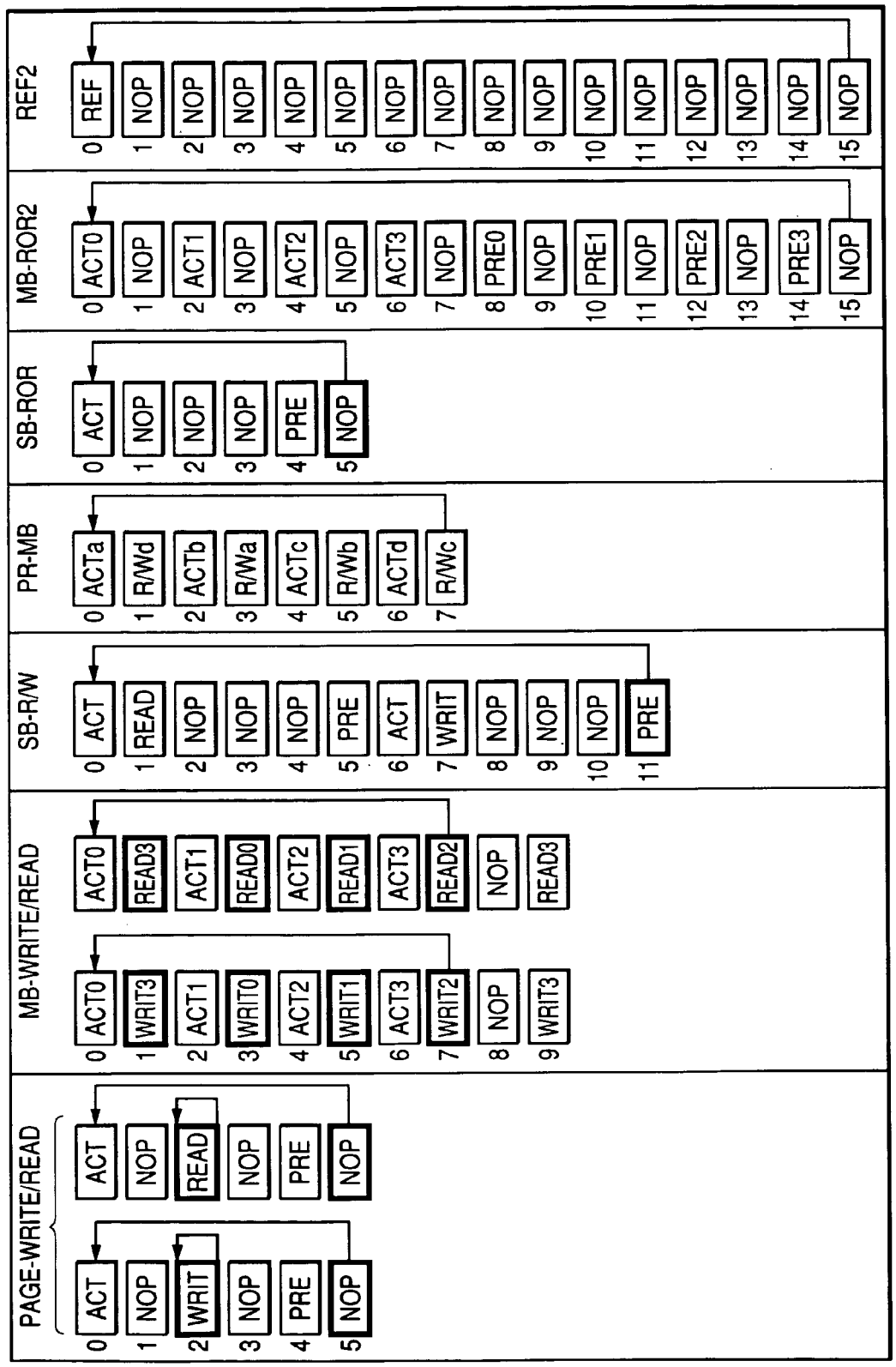
FIG. 18 illustrates timing sequences achieved by test sequencers.

FIG. 18 shows examples of timing sequences achieved by a plurality of test sequencers 31. MB (Multi Bank)-Write/Read sequence is shown. In this sequence, write or read may be repeated. Suffixes 0 to 3 denote memory bank names. In WRIT3, WRIT0, WRIT1, WRIT2, READ3, READ0, READ1, and READ2, the bank address counter 41 may be forcibly incremented. This may be done to alternately switch among memory banks.

SB (Single Bank)-R/W sequence is shown. In this sequence, read and write may be performed. In PRE, the X address counter 40 may be forcibly incremented. This may be done to successively select X addresses for processing.

PR (Pseudo Random)-MB (Multi Bank) sequence is shown. Suffixes a, b, c, and d denote memory bank names 0 to 3, respectively.

SB-ROR (RAS Only Refresh) sequence is shown. In NOP, the bank address counter 41 may be forcibly incremented. This may be done to perform RAS only refresh by changing a memory bank. In FIG. 22, MB-ROR (RAS Only Refresh) 2 sequence is shown. Suffixes 0 to 3 denote memory bank names.

REF2 sequence is shown. NOP may be repeated, such as, for example, 15 times. Repeat counts may be managed using the general-purpose timer 57 as previously described.

PAGE-Write/Read sequence is shown. In this sequence, page writing may be performed in a word line unit by repeating WRIT, or page reading may be performed in a word line unit by repeating READ. Therefore, in WRIT and READ, the Y address counter 42 may be forcibly incremented. In NOP, the X address counter 40 may be incremented. This may be done to proceed to processing for the next page.

Figure 19:
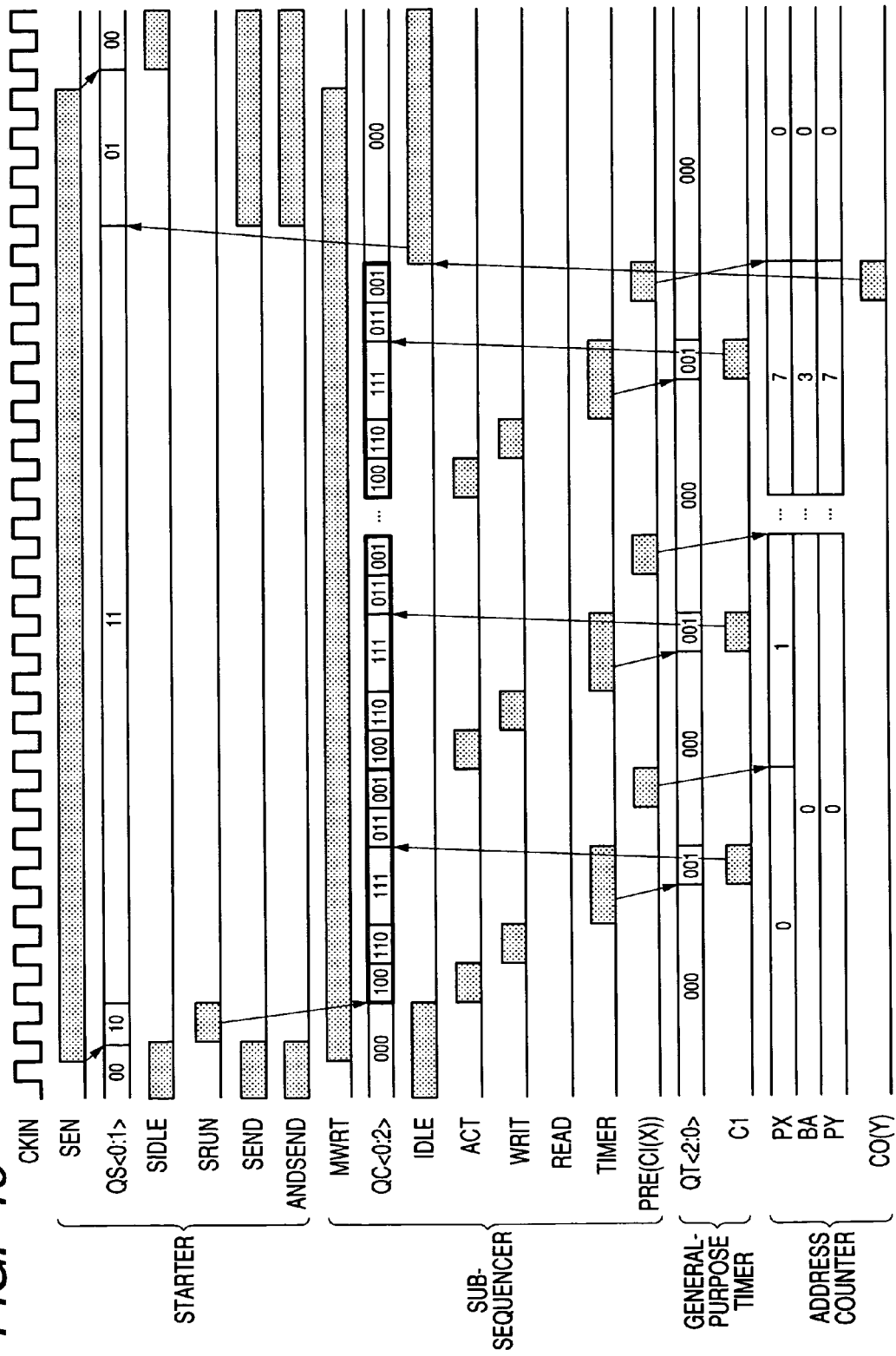
FIG. 19 is a timing chart of a timing generation operation of a test sequencer.

FIG. 19 shows timing of test sequencers 31. In this example, the SB-Write/Read timing sequence of FIG. 12 is performed.

As mentioned above, the BIST circuit 3 may use a plurality of test sequencers 31 to generate test timing. By providing a plurality of test sequencers 31, the BIST circuit 3 my use a variety of test timings. Thereby, in comparison with an ALPG that requires an independent memory for program storage, logical size and chip occupation area are reduced by the use of the present invention. Since specific test sequencers 31 ma be mounted on a given chip, the test sequencers to be mounted can be easily customized by product or type, and area overhead can thus be further reduced. Since the timing output of each test sequencer 31, that is, output of subsequencer 51I, is selected by the tri-state buffer 52i before being supplied to the bus 53, the number of wirings of sequencer outputs can be reduced more than in an AND-OR multiplexer system.

Figure 20:
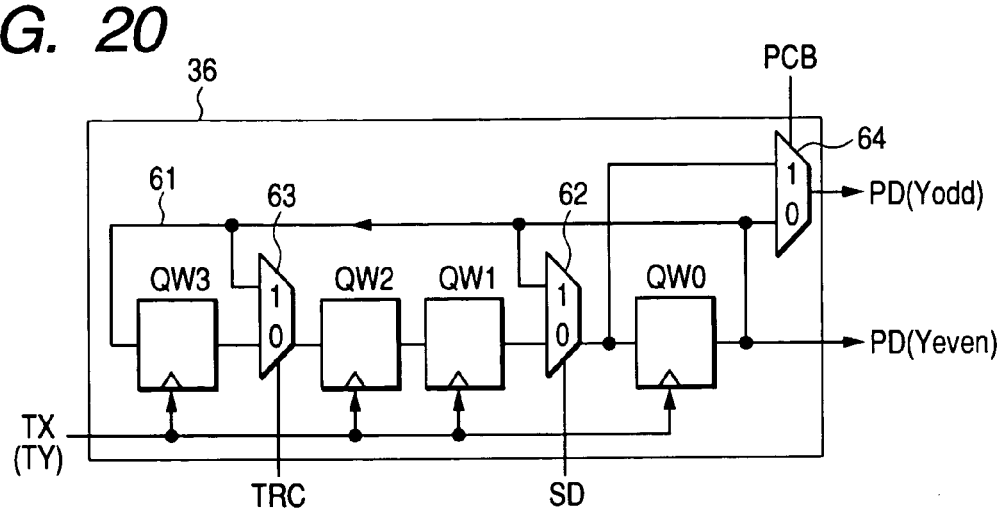
FIG. 20 is a logical circuit diagram showing a write data generating circuit.

FIG. 20 shows a write data generating circuit 36. Noting the periodicity of test pattern data, the write data generating circuit 36 may be configured to generate write data PD for a plurality of test modes by the use of a shift register having a feedback loop, for example. The shift register may include latches QW3 to QW0 of four stages (4 bits), connected in series as bits of storage stages.

A first feedback loop 61 may be provided in which the output of a first latch QW0 of output side is fed back to the input of a last latch QW3 of output side. A selector 62 (first selector) that selects between the output of latch QW1 and the output of latch QW0 may be disposed between the latches QW1 and QW0. A selector 63 that selects between the output of latch QW3 and the output of latch QW0 may be disposed between the latches QW3 and QW2. Furthermore, a selector 64 (second selector) that selects between the output and input of latch QW0 may be present. Selection signals SD, TRC, and PCB of the selectors 62, 63, and 64, respectively, may be outputted from the BIST control circuit 30. Input selected by a logical value of the selection signals is as shown. For example, when SD=1, the output of QW0 is selected, and when SD=0, the output of QW1 is selected. The clock terminals of the latches QW3 to QW0 may be supplied with an X address transition clock TX that synchronizes with a change in X address, or a Y address transition clock TY signal that synchronizes with a change in Y address. The transition clock signal TX and TY used is controlled dynamically by the test sequencers 31 according to the addressing mode.

Figure 21:
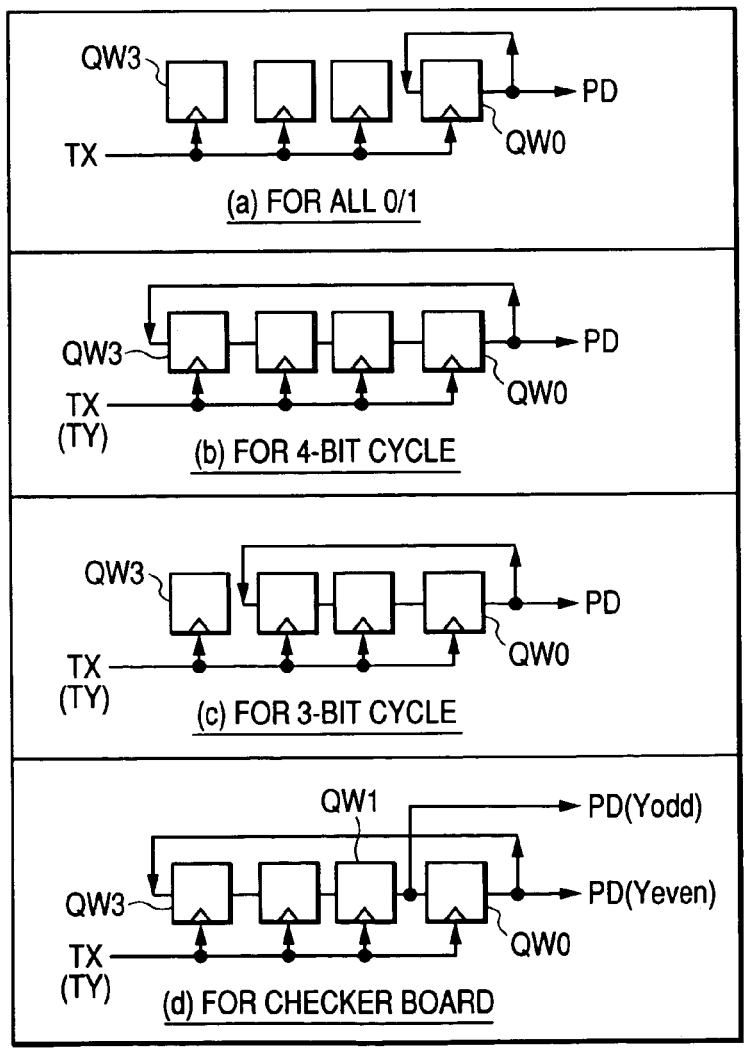
FIG. 21 illustrates operation modes of write data generating circuit equivalents.

FIG. 21 shows operation modes of the write data generating circuit 36. When test write data PD with 0 or 1 in all bits is to be generated, the output of the latch QW0 is fed back to its input, as in (a). This is equivalent to a shift register operation of one cycle per round. When test write data PD is to be generated at a 4-bit cycle, the output of the latch QW0 is fed back to the input of the latch QW3, as in (b). This is equivalent to a shift register operation of four cycles per round. When test write data PD is to be generated at a 3-bit cycle, the output of the latch QW0 is fed back to the input of the latch QW2 as in (c). This is equivalent to a shift register operation of three cycles per round. When test write data PD is to be generated by a "checker board", as in (d), the output of the latch QW0 is fed back to the input of the latch QW3, and the output of the latch QW0 and the output of the latch QW1 are outputted as data in an even Y address and data in an odd Y address, respectively.

FIG. 22 shows examples of generating write data by the write data generating circuit 36. In the figure, a symbol * denotes that an item is undefined. FIG. 22(*a*) shows the generating of write data of all 1 bits or all 0 bits by the write data generating circuit 36.

FIG. 22(*b*) shows an example of generating write data of single row/column by the write data generating circuit 36. The generation is performed at a 4-bit cycle. The figure shows a memory cell array to which data of QW<3:0>=1010 has been written in single row stripe mode. TX is used for a transition clock. The transition clock TY is used for writing in single column stripe mode.

FIG. 22(*c*) shows an example of generating write data of double row/column stripe by the write data generating circuit 36. The generation is performed at a 4-bit cycle. The figure shows a memory cell array to which data of QW<3:0>=1100 has been written in double row stripe mode. TX is used for a transition clock. The transition clock TY is used for writing in double column stripe mode.

FIG. 22(*d*) shows an example of generating write data of checker board by the write data generating circuit 36. The generation is performed at a 4-bit cycle. The figure shows a memory cell array to which writing has been performed with checkerboard of QW<3:0>=1010. TX is used for a transition clock.

FIG. 22(*e*) shows an example of generating write data of 3-bit cycle by the write data generating circuit 36. The figure shows a memory cell array to which writing has been performed with QW<3:0>=*010. TX is used for a transition clock.

By adopting the write data generating circuit 36 of the above-mentioned shift register configuration, rather than a general-purpose pattern generating circuit configured to selectively generate given patterns upon the loading of control data stored in ROM, as in a typical ALPG, write data of a variety of patterns can be easily generated on a comparatively small logical scale.

Figure 23:
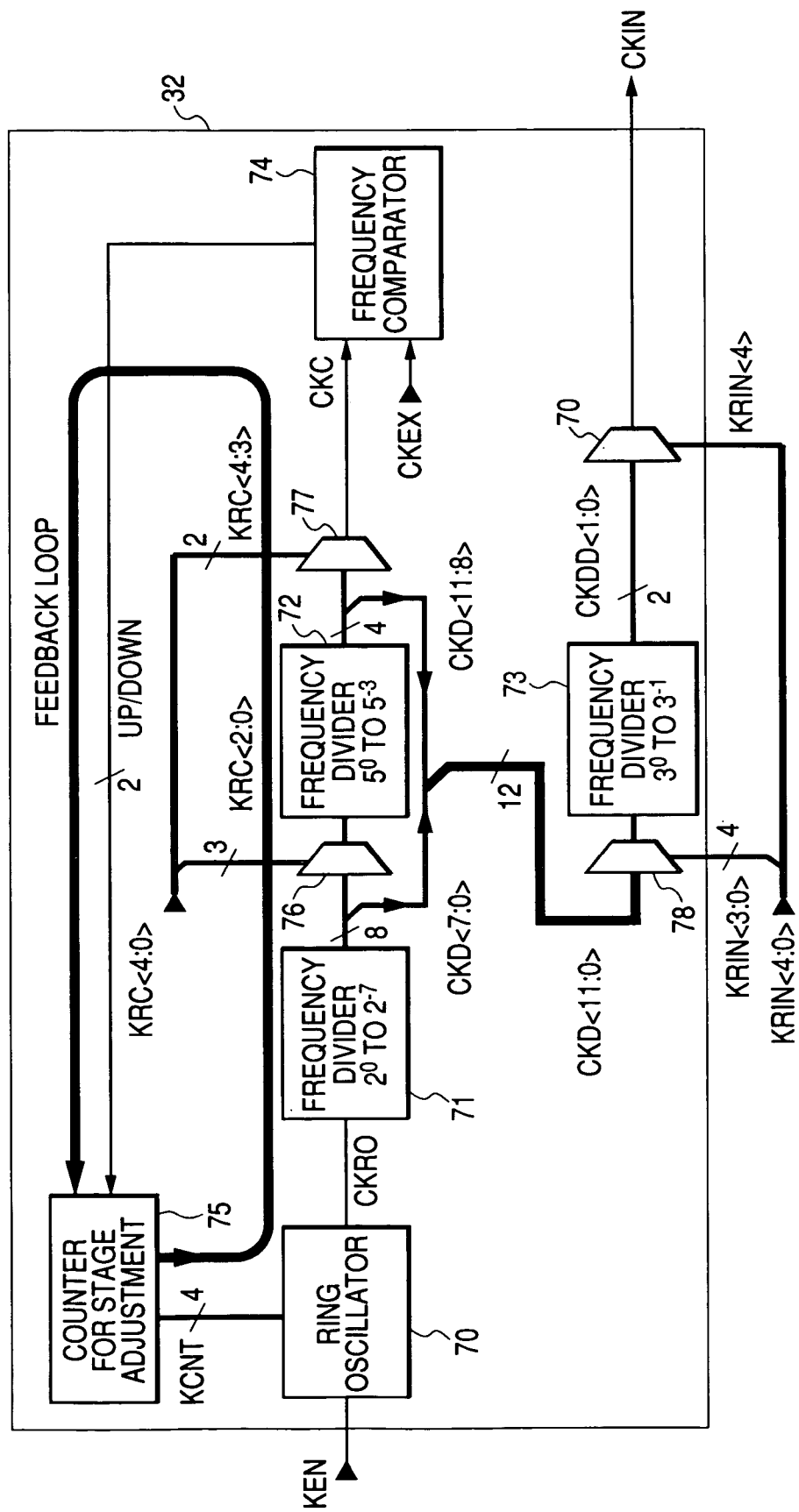
FIG. 23 is a block diagram showing a clock generating circuit.

FIG. 23 shows a clock generating circuit 32. The clock generating circuit 32 may include a ring oscillator 70 capable of changing the number of gate stages of an oscillation loop, changeable frequency dividers 71 to 73 that frequency-divide the output of the ring oscillator 70, a frequency comparator 74 that compares predetermined output of the changeable frequency divider 72 with the frequency of an external clock signal CKEX, and a counter 75 for adjusting the number of stages that increment or decrement according to a comparison result by the frequency comparator 74. A count value KCNT of the counter 75 may be used to select an oscillation loop of the ring oscillator 70 so as to match predetermined output of the changeable frequency divider 72 to the frequency of an external clock signal CKEX. The frequency comparator 74 and the counter 75 may include an oscillation frequency control circuit that adjusts the number of gate stages of the oscillation loop based on the result of comparing a predetermined output of the changeable frequency divider 72 and the external clock signal CKEX.

The frequency divider 71 frequency-divides oscillation output CKR0 of the ring oscillator 70 at a frequency division ratio of $2^0$ to $2^{-7}$, and thus outputs eight clock signals CKD<7:0>. The frequency divider 72 inputs one clock signal selected from among the eight clock signals, as selected by a selector 76, and frequency-divides the clock signal at a frequency division ratio of $5^0$ to $5^{-3}$, to thus output four clock signals CKD<11:8>. One of the four clock signals CKD<11:8> is selected by a selector 77 and supplied to the frequency comparator 74 as a clock signal CKC. The frequency divider 73 inputs one clock signal selected by selector 78 from the 12 clock signals CKD<11:0>, and frequency-divides that clock signal at a frequency division ratio of $3^0$ to $3^{-1}$ to output two clock signals CKDD<1:0>. One of the two clock signals CKDD<1:0> is selected by a selector 79 and output as the internal clock signal CKIN. KRC<2:0> and KRC<4:3> are selection control signals of the selectors 76 and 77, respectively. KRIN<3:0> and KRIN<4> are selection control signals of the selectors 78 and 79, respectively. The selection control signals KRC<4:0> and KRIN<4:0> are supplied from the BIST control circuit 30.

Figure 24:
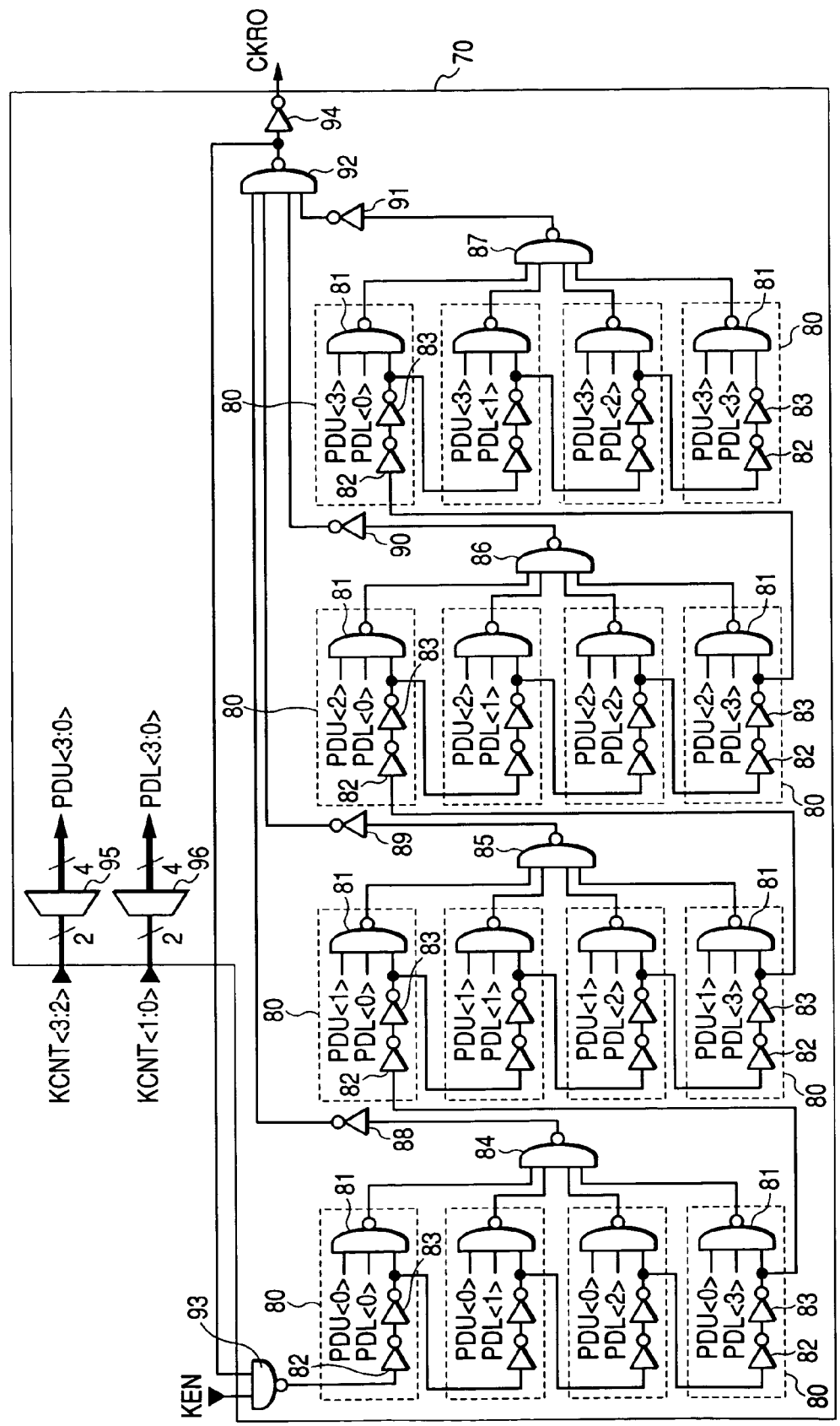
FIG. 24 is a logical circuit diagram showing a ring oscillator.

FIG. 24 shows a ring oscillator 70. The ring oscillator 70 shown may variably adjust the number of gate stages of an oscillation loop by, for example, 16 steps. The ring oscillator 70 shown illustratively has 16 delay gate units 80. The delay gate units 80 each include a three-input NAND gate NAND 81, and inverters 82 and 83 connected in series with the NAND 81. The NAND gate NAND81 admits PDU<i>, PDL<j>, and an output of the inverter 83. The output of an inverter 83 of a delay gate unit 80 of a preceding stage is connected to the input of an inverter 82 of a delay gate unit 80 of a following stage. In this way, an oscillation loop is formed by the stages, such as the 16 stages, of the delay gate units 80. In this exemplary embodiment, outputs of NAND gate NANDs 81 of the delay gate units 80 of the first four stages are inputted to a four-input NAND gate NAND 84. Outputs of NAND gate NANDs 81 of the delay gate units 80 of next four stages are inputted to a four-input NAND gate NAND 85. Outputs of NAND gate NANDs 81 of the delay gate units 80 of next four stages are inputted to a four-input NAND gate NAND 86. Outputs of NAND gate NANDs 81 of the delay gate units 80 of last four stages are inputted to a four-input NAND gate NAND 87. Outputs of the NAND gates NAND 84 to NAND 87 are inputted to a four-input NAND gate NAND 92 through inverters 88, 89, 90, and 91. Output of the NAND gate NAND 92 is fed back to the first-stage delay gate unit 80 through a two-input NAND gate NAND 93. Output of a NAND gate NAND92 is inverted by an inverter 94 and supplied to the frequency divider 71 as a clock signal CKRO.

The count value KCNT may include, for example, 4 bits (KCNT<3:0>), and may be decoded into control signals PDU<3:0> and PDL<3:0> by pre-decoders 95 and 96. The control signals PDU<3:0> and PDL<3:0> may be supplied to the individual NAND gates NAND81 as PDU<i> and PDL<j> according to a predetermined decoding logic. One PDU<i> and one PDU<j> of the eight control signals PDU<3:0> and PDL<3:0> may be high. ANAND gate 81 to which PDU<i> and PDL<j> high are supplied may generate a logic output conforming to an output of an inverter 82. The number of gate stages of the oscillation loop may differ according to the position of the NAND gate 81 that forms the logic output. Thereby, oscillation frequencies of the ring oscillator 70 may be varied.

Figure 25:
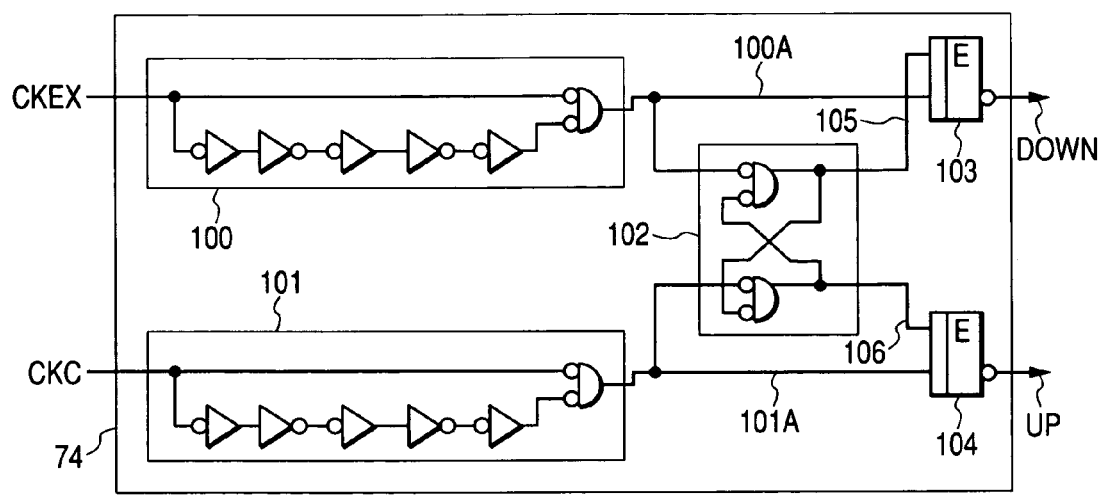
FIG. 25 is a logical circuit diagram showing a frequency comparator.

FIG. 25 shows a frequency comparator 74. The frequency comparator 74 may include a pulse generating circuit 100 that outputs a single pulse signal each time the rising edge of the clock signal CKC as a reference signal appears, a pulse generating circuit 101 that outputs a single pulse signal each time the rising edge of the clock signal CKC as a feedback signal appears, a flipflop 102 of set/reset type, and flipflops 103 and 104 of edge-triggered type. In this circuit, when the reference signal CKEX falls, a single pulse signal may be outputted from the pulse generating circuit 100 and may serve as a clock signal of the flipflop 103. When the single pulse signal is generated, output 105 of the flipflop 102 may be captured, and put to a low level thereafter by the single pulse signal. When the feedback signal CKC falls, a single pulse signal may be outputted from the pulse generating circuit 101. The single pulse signal may serve as a clock signal of the flipflop 104. When the single pulse signal is generated, output 106 of the flipflop 102 may be captured to flipflop 104, and put to a low level thereafter by the single pulse signal. Unless the falling reference signal CKEX and the falling feedback signal CKC appear at the same time, if one of elements 105 and 106 goes into a low level, the other goes into a high level. If the two signals appear at the same time, a high level develops where the single pulse falls first, and a low level develops on the other side. Accordingly, after the reference signal CKEX and the feedback signal CKC become approximately equal in phase and frequency, and since the falling reference signal CKEX and the falling feedback signal CKC typically alternate approximately every half cycle, a high level is typically captured in the flipflops 103 and 104. However, if one of the frequencies of the reference signal CKEX and the feedback signal CKC remains high, each time a phase difference of one cycle occurs a single pulse appears twice in succession on the side of higher frequency, and a low level is captured in the flipflop 103 or 104. This is output as signals UP and DOWN indicating that there is a difference in frequencies.

Figure 26:
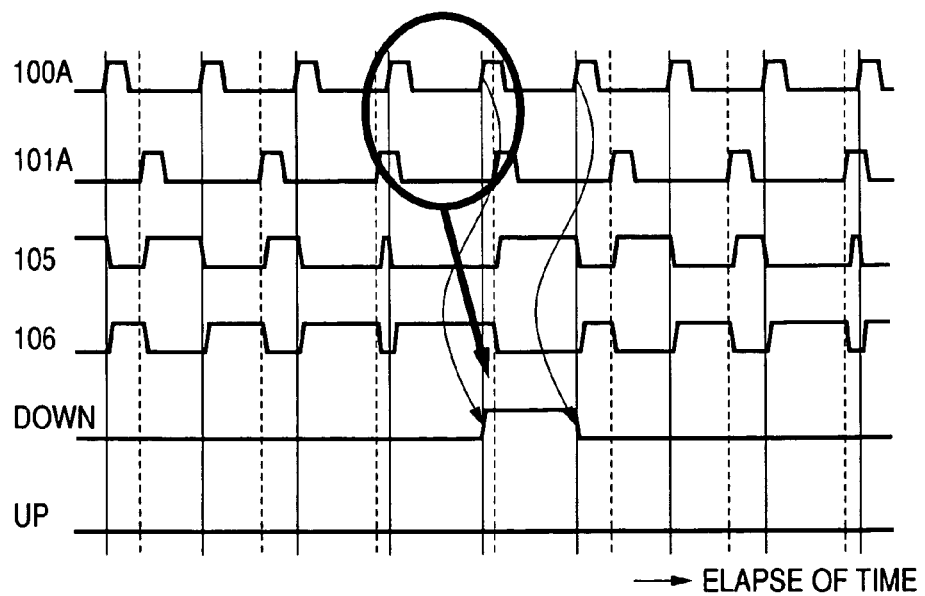
FIG. 26 is a timing chart showing operation waveforms of a frequency comparator.

FIG. 26 shows operation waveforms of the frequency comparator 74. As shown in the operation waveform 110, if a low-level period of one of the waveforms of node signals 100A and 101A is contained in a low-level period of the other, output corresponding to the interior period goes to a high level. Since sensitivity becomes higher in the node signal 100A and 101A that has a smaller duty ratio of the waveform, it is desirable to provide the pulse generating circuits 100 and 101 as shown in FIG. 25. If the duties of the clock signals CKEX and CKC are small, the pulse generating circuits 100 and 101 are not required and may be omitted.

Figure 27:
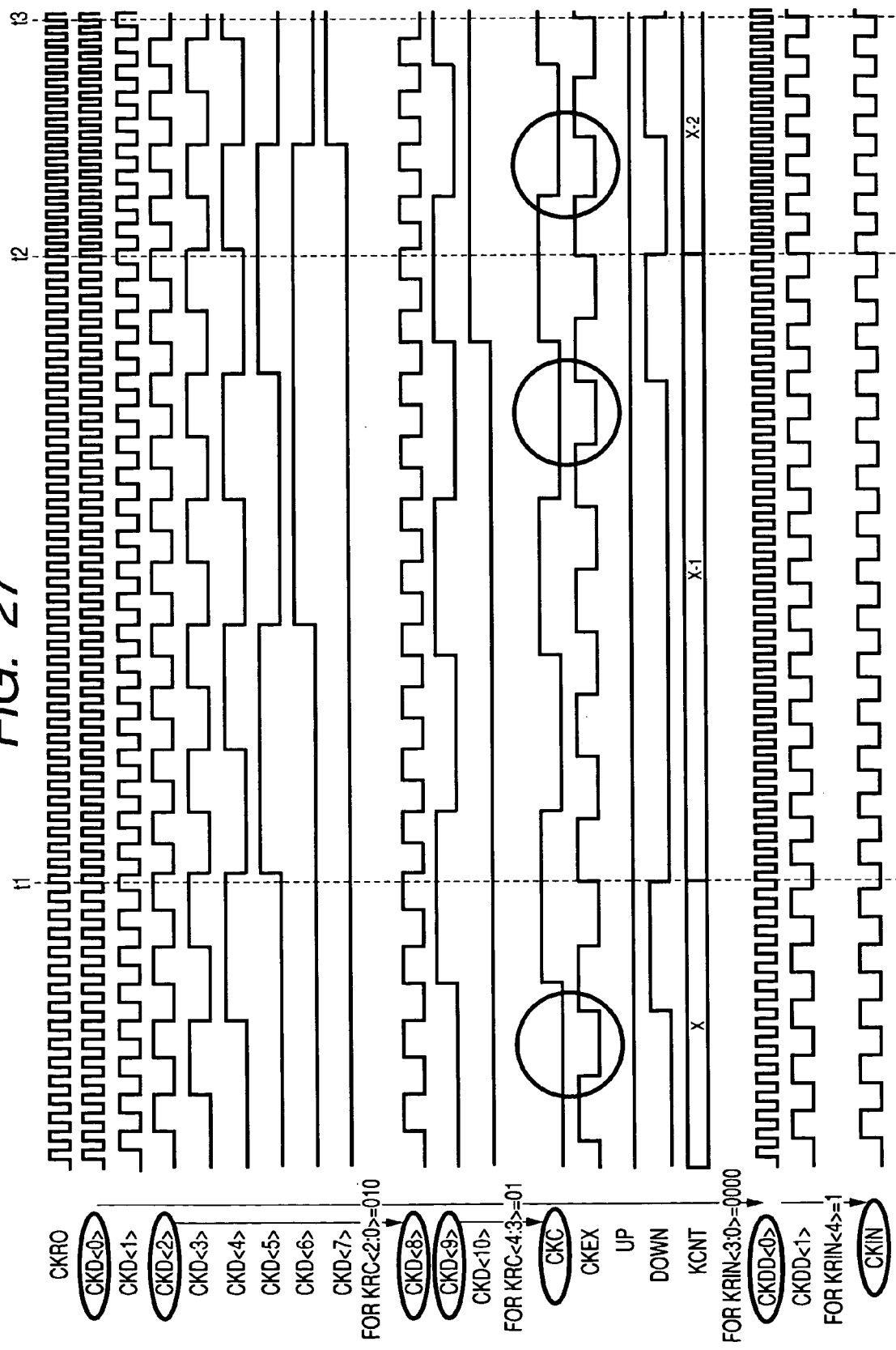
FIG. 27 is a timing chart showing clock generation operation timing by a clock generating circuit.

FIG. 27 shows clock generation operation timing by the clock generating circuit 32. For example, a clock signal CKC may be generated through CKD<2>, CKD<8>, and CKD<9>. In this example, at times t1, t2, and t3, KCNT is successively decremented, and CKIN increases gradually in frequency.

If the clock generating circuit 32 is used, the external clock signal CKEX may be a clock signal of a relatively low frequency, such as operation frequencies supported by low-speed testers. If the frequency division ratio of the clock signal CKIN used as a test clock signal is smaller than that of the clock signal CKC inputted to the comparator 74, the frequency of the test clock signal CKIN may be made higher than the low-speed clock signal CKEX of the tester, contributing to speedup in tests. For example, a frequency hundreds of times that of the external clock signal CKEX can be obtained. Further, since the ring oscillator 70 capable of changing the number of gate stages of an oscillation loop is used to generate a desired frequency, rather than a PLL circuit, circuit scale can be significantly reduced at a minor cost of accuracy of the frequency synchronization, and thus a significant reduction in chip occupation area can be obtained with little sacrifice of performance.

Figure 28:
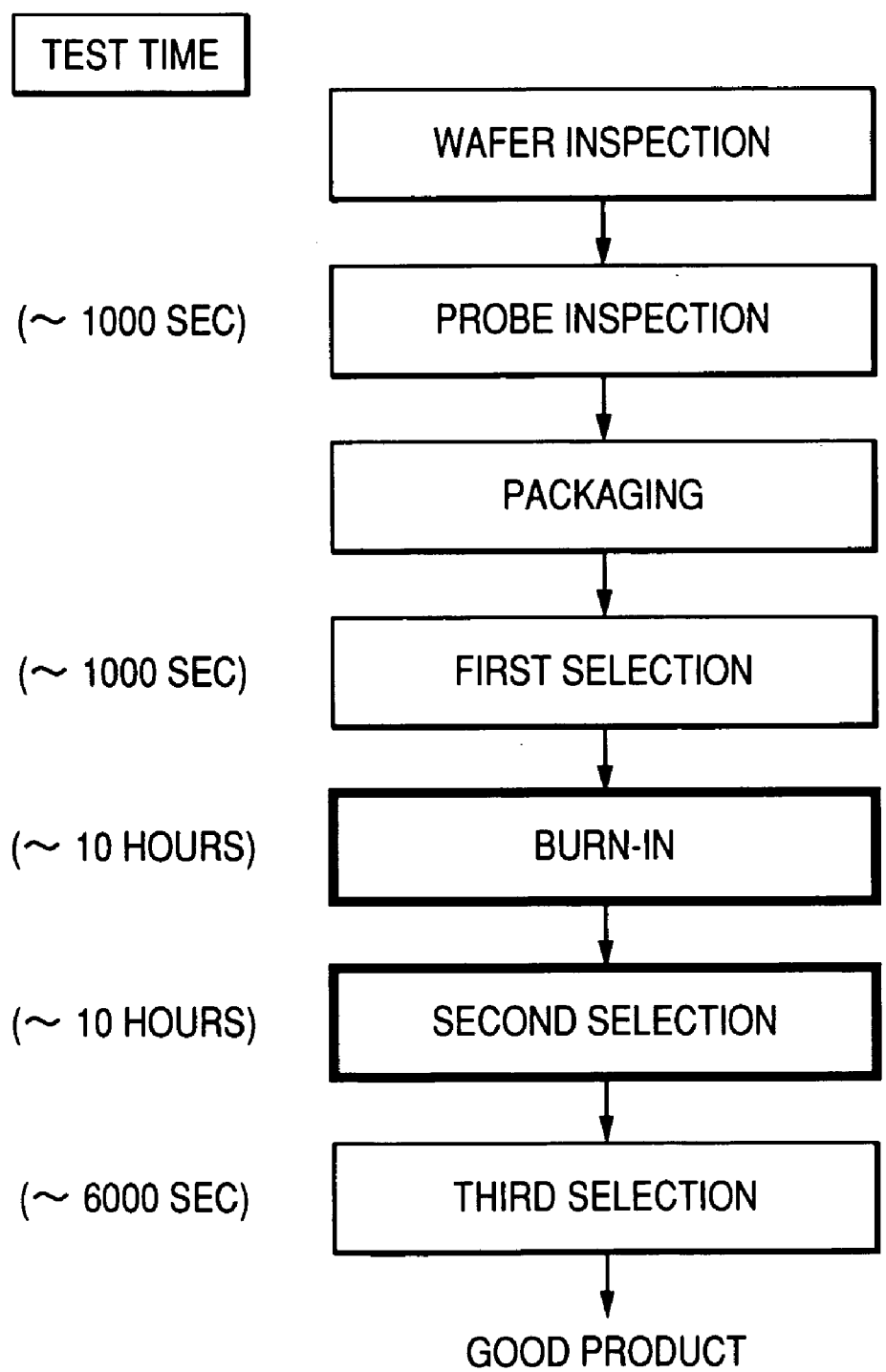
FIG. 28 is a diagram showing a test flow of a SDRAM.

FIG. 28 shows a test flow of SDRAM. A non-defective SDRAM may be obtained through wafer inspection, probe inspection, packaging, and first selection by a high-speed tester, burn-in, with second selection and third selection by a low-speed tester. In the second selection, low-speed function tests may be performed at low and high temperatures. In the third selection, a data retention test may be performed for almost one-third the period. Use of the low-speed tester is desirable to reduce test costs. Since a BIST circuit is used, use of the low-speed tester will not result in significant increase in test time. Simple function tests and simple data retention tests, which are performed in the first high-speed selection, may be achieved using a low-speed tester and a BIST circuit on-chip.

For example, if a BIST circuit is added to DDR-SDRAM, the number of circuit elements may increase by an estimated 5590 NAND gates, and wiring areas may increase by 20 areas, in a 1.3 µm process. The former causes an increase in area by 0.56 mm², and the latter causes an increase in area by 0.40 mm², thereby bringing an estimated increase in manufacturing costs to about $0.12 cents USD. It is estimated that test time is reduced by about 2000 seconds through the use of a BIST circuit 3. If test cost is about 0.03 cents per second, building a BIST circuit 3 on the chip reduces costs by about 70 cents per chip.

If not otherwise stated herein, it may be assumed that all components and/or processes described heretofore may, if appropriate, be considered to be interchangeable with similar components and/or processes disclosed elsewhere in the specification. It should be appreciated that the systems and methods of the present invention may be configured and conducted as appropriate for any context at hand. The embodiments described hereinabove are to be considered in all respects only as illustrative and not restrictive. For example, the number of memory banks may be changed as required without limitation. The addressing modes are not limited to those discussed hereinabove, and the write data generation patterns are not limited to those discussed hereinabove. The memory, without limitation, may be SDRAM, SRAM, MRAM, FeRAM, flash memory, or any other ROMs. The memory may be a multiport memory or an associative memory. The present invention may apply to LSI memory, liquid crystal drive circuits equipped with memory, and semiconductor integrated circuits, such as graphic control devices and microcomputers. As such, all modifications and variations of the present invention that come within the meaning, range, and equivalency of the claims hereinbelow are to be embraced within the scope thereof

What is claimed is:

1. A semiconductor integrated circuit, comprising:
    a memory that includes a plurality of memory banks, the memory being accessed by specifying access addresses, the access addresses including bank addresses, X addresses in each bank and Y addresses in each bank;
    a self-tester which tests the memory in response to a test enable signal, control signals and address signals and generates test control codes for the memory and the access addresses, the address signals corresponding to the access addresses;
    wherein the self-tester comprises
        a test controller which receives the test enable signal, the control signals and the address signals, and generates select signals as test sequence commands that instruct test sequences, and
        a plurality of test sequencers each of which corresponds to each of the test sequences, and is selected in response to the select signals, and
    wherein the test sequences differ in a manner of scanning at least one of the X addresses, the Y addresses, and the bank addresses.

2. The semiconductor integrated circuit according to claim 1,
    wherein the test sequences are selected from single bank X scanning that updates the bank addresses after one round of the X addresses, single bank Y scanning that updates the bank addresses after one round of the Y addresses, and multi-bank X scanning that updates the X addresses after one round of the bank addresses.

3. The semiconductor integrated circuit according to claim 1,
    wherein the memory banks have plural dynamic memory cells arrayed in a matrix, and
    wherein the semiconductor integrated circuit is configured as a synchronous DRAM.

4. A semiconductor integrated circuit, comprising:
    a memory core which includes a plurality of memory banks accessed by specifying access addresses, the access addresses including one of bank addresses, one of X addresses and one of Y addresses;
    an interface circuit which receives an external control signal and address signals from outside of the semiconductor integrated circuit and provides a test enable signal, an internal control signal and internal address signals; and
    a self-tester which tests the memory core in response to the test enable signal, the internal control signal and the internal address signals and generates test control codes for the memory core and the access addresses,
    wherein the self-tester comprises a test controller which receives the test enable signal, the internal control signals and the internal address signals, and which generates select signals as test sequence commands that instruct test sequences, and a plurality of test sequencers each of which corresponds to each of the test sequences and is selected in response to the select signals,
    wherein the test sequences differ in a manner of scanning at least one of the X addresses, the Y addresses, and the bank access addresses; and
    wherein the self tester has an address counter in accordance with the test sequences.

5. The semiconductor integrated circuit according to claim 4,
    wherein the plurality of test sequences are selected from single bank X scanning that updates the bank addresses after one round of the X addresses, single bank Y scanning that updates the bank addresses after one round of the Y addresses, and multi-bank X scanning that updates the X addresses after one round of the bank addresses.

6. The semiconductor integrated circuit according to claim 5, further comprising a write data generating circuit,
    wherein the write data generating circuit generates write data for the plurality of test sequences using at least one shift register having at least one feedback loop,
    wherein the write data generating circuit includes
    a shift register of plural bits,
    a first feedback loop through which an output of an output side start storage stage of the shift register is fed back to an input of an output side end storage stage,
    a first selector that selectively feeds back the output of the output side start storage stage of the shift register to the input of the output side start storage stage, and
    a second selector that selects between the output and the input of the output side start storage stage of the shift register, and wherein the first selector and the second selector are controlled by the self-tester individually.

7. The semiconductor integrated circuit according to claim 4, including a clock generating circuit that generates a clock signal for test supplied to the memory,
wherein the clock generating circuit comprises a ring oscillator capable of changing a number of gate stages of an oscillation loop, changeable frequency dividers that frequency-divide an output of the ring oscillator, and an oscillation frequency control circuit that controls the number of gate stages of the oscillation loop based on comparison between a predetermined output of the changeable frequency dividers and an external clock signal.

8. The semiconductor integrated circuit according to claim 7, wherein the ring oscillator includes plural selectable oscillation loops that differ in the number of gate stages.

9. The semiconductor integrated circuit according to claim 8,
wherein the oscillation frequency control circuit includes a frequency comparator that compares a frequency of the predetermined output of the changeable frequency dividers with a frequency of the external clock signal, and a counter that increments or decrements a count value according to the comparison by the frequency comparator, and
wherein a count value of the counter is used to select an oscillation loop of the ring oscillator to match the frequency of the predetermined output of the changeable frequency dividers to the frequency of the external clock signal.

* * * * *